(12) United States Patent
Ventzek et al.

(10) Patent No.: US 7,592,248 B2
(45) Date of Patent: Sep. 22, 2009

(54) METHOD OF FORMING SEMICONDUCTOR DEVICE HAVING NANOTUBE STRUCTURES

(75) Inventors: Peter L. G. Ventzek, Austin, TX (US); Marius K. Orlowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 323 days.

(21) Appl. No.: 11/298,148

(22) Filed: Dec. 9, 2005

(65) Prior Publication Data
US 2009/0142934 A1 Jun. 4, 2009

(51) Int. Cl.
*H01L 21/4763* (2006.01)
(52) U.S. Cl. .............. 438/622; 257/758; 257/E21.585; 257/E23.165
(58) Field of Classification Search .......... 438/622; 257/758, E21.585, E23.165
See application file for complete search history.

(56) References Cited

U.S. PATENT DOCUMENTS

| | | | |
|---|---|---|---|
| 5,345,105 A | 9/1994 | Sun et al. | |
| 6,420,092 B1 * | 7/2002 | Yang et al. | 430/311 |
| 6,518,194 B2 | 2/2003 | Winningham et al. | |
| 2002/0163079 A1 * | 11/2002 | Awano | 257/750 |
| 2004/0169281 A1 * | 9/2004 | Nguyen et al. | 257/758 |
| 2006/0063392 A1 * | 3/2006 | Ventzek et al. | 438/778 |
| 2006/0073682 A1 * | 4/2006 | Furukawa et al. | 438/506 |

OTHER PUBLICATIONS

Klinke et al., "Comparative Study of the Catalytic Growth of Patterned Carbon Nanotube Films," Surface Science, Jul. 11, 2001, pp. 195-201, 2001 Elsevier Science B.V.

Perdigon-McLon et al., "Micrometric BN Powders Used as Catalyst Support: Influence of teh Precursor on teh Properties of teh BN Ceramic," Journal of Solid-State Chemistry, Oct. 2, 2002, pp. 609-615, 2003 Elsevier Inc.

Mo et al., "The Growth Mechanism of Carbon Nanotubes From Tehrmal Cracking of Acetylene Over Nickel Catalyst Supported on Alumina," Synthetic Metals, Jun. 15, 2000, pp. 443-447, 2001 Elsevier Science B.V.

Hernadi et al., "On the Role of Catalyst, Catalyst Support and Their Interaction in Synthesis of Carbon Nanotubes by CCVD," Materials Chemistry and Physics, Sep. 2, 2001, pp. 536-541, 2002 Elsevier Science B.V.

Cumings et al., "Mass-Production of Boron Nitride Double-Wall Nanotubes and Nanococoons," Chemical Physics Letters, Oct. 4, 1999, pp. 211-216, 2000 Elsevier Science B.V.

Kreupl et al., "Carbon Nanotubes for Interconnect Applications," Infineon Technologies AG, 2004 IEEE, Munich, Germany.

Li et al., "Bottom-Up Approach for Carbon Nanotube Interconnects," NASA Ames Research Center, Apr. 14, 2003, pp. 2491-2493, vol. 82, No. 15, Applied Physics Letters, 2003 American Institute of Physics, California.

(Continued)

*Primary Examiner*—Steven J. Fulk

(57) ABSTRACT

A semiconductor device having upright dielectric nanotubes at an inter-layer dielectric level and method of manufacturing such a device is disclosed. The use of a catalyst is proposed in the disclosed manufacturing flow that facilitates growth of upright dielectric nanotubes having ultra low-k values that form all or part of the dielectric material for an ILD. In one embodiment, carbon nanotubes form interlayer conducting vias. In another embodiment dielectric material nanotubes form reinforcing pillars. The integration of catalysts is proposed to accommodate both upright dielectric and upright conducting nanotube fabrication in the same layer.

11 Claims, 22 Drawing Sheets

OTHER PUBLICATIONS

Nihei et al., "Simultaneous Formation fo Multiwall Carbon Nanotubes and Their End-Bonded Ohmic Contacts to Ti Electrodes for Future ULSI Interconnects," Fujitsu Limited, Sep. 18, 2003, pp. 1856-1859, Japanese Journal of Applied Science, vol. 43, No. 4B, 2004.

Badini, C. et al., "The Effects of Carbon, Chromium and Nickel on the Hardness of Bonded Layers," Surface and Coatings Technology, 30 (1987), pp. 157-170.

Chen, Z. et al., "Preparation of Nanosized Cobalt Aluminate Powders by a Hydrothermal Method," Materials Science and Engineering B107 (2004), pp. 217-233.

Delzeit, L. et al., "CVD Growth of Carbon Nanotubes: Catalyst, Growth, and Structure," Chemical Physics Letters 348 368 (2001), 1 page.

Hafner, J. et al., "Catalytic Growth of Single-wall Carbon Nanotubes from Metal Particles," Chemical Physics Letters 296, Oct. 30, 1998; pp. 195-202.

Kanzow H. et al., "Laser-assisted Production of Multi-walled Carbon Nanotubes from Acetylene," Chemical Physics Letters 295, Oct. 23, 1998; pp. 525-530.

Louchev, Oleg A. "Surface Diffusion Growth and Stability Mechanism of BN Nanotubes Produced by Laser Beam Heating Under Superhigh Pressures," American Institute of Physics, Applied Physics Letters 71(24), Dec. 15, 1997; pp. 3522-3524.

Louchev, O. et al., "Mechanism of Thermokinetical Selection Between Carbon Nanotube and Fullerene-like Nanoparticle Formation," American Institute of Physics, Journal of Applied Physics, vol. 91, No. 12, Jun. 15, 2002; pp. 10074-10080.

Lourie, O. et al., "CVD Growth of Boron Nitride Nanotubes," Chemistry of Materials published by American Chemical Society, Chemical Materials 2000 12 (7), Publication Date (Web) Jun. 14, 2000; downloaded from <http://pubs.acs.org> on May 12, 2009; 4 pages.

Van Der Lang, N.J. et al., "Structural, Elastic, Thermophysical and Dielectric Properties of Zinc Aluminate (ZnAl(2))(4))," Journal of the European Ceramic Society 24 (2004), pp. 2417-2424.

Zhang, X. et al., "Dielectric Properties of MoS(2) and Pt Catalysts: Effects of Temperature and Microwave Frequency," Catalysis Letters vol. 84, Nos. 3-4, Dec. 2002, 9 pages.

* cited by examiner

METHOD OF FORMING SEMICONDUCTOR DEVICE HAVING NANOTUBE STRUCTURES

BACKGROUND

1. Field of the Disclosure

The present disclosure relates generally to semiconductor devices and their processing and more particularly to the formation of electronic devices having nanotube structures.

2. Description of the Related Art

Ultra low-k (ULK) dielectric materials are useful as dielectric materials between metal levels as they facilitate a reduction of capacitive coupling between metal lines at different levels. However, while the use of ULK materials provides promise, materials used to form ULK structures, such as porous SiCOH, organic-based materials, and Silicon-Carbon-Oxygen-Fluorine-based materials, are susceptible to damage from subsequent manufacturing processes to which they are exposed. For example, etch processes; thermal processes; and CMP processes all have negative effects on conventional ULK materials due to their poor mechanical and thermo-mechanical behavior. For example, conventional ULK materials are relatively soft resulting in severe planarization issues, especially when the ULK material is used to fill large spaces between more rigid structures. The use of ULK materials in this manner as an interconnect structure creates the potential of collapse of the interconnect structure when the chip is packaged.

In addition to the physical difficulties of using traditional ULK materials, it is recognized that their k-values have a tendency to increase as a result of species inter-diffusion and reaction that occurs as a result of being exposed to etch, thermal, and polishing processes typical in semiconductor device interconnect formation. Therefore, an interconnect structure and method implementing ULK materials in devices that overcome these problems would be useful.

BRIEF DESCRIPTION OF THE DRAWINGS

The present disclosure may be better understood, and its numerous features and advantages made apparent to those skilled in the art by referencing the accompanying drawings.

Those skilled in the art of the present disclosure will appreciated that elements in the figures are illustrated for simplicity and clarity and have not necessarily been drawn to scale. For example, the dimensions of some of the elements in the figures may be exaggerated relative to other elements to help to improve understanding of embodiments of the invention.

DESCRIPTION OF THE PREFERRED EMBODIMENT(S)

A semiconductor device having dielectric nanotubes at an inter-level dielectric level (ILD) and method of manufacturing such a device is disclosed. The use of catalysts is proposed in the disclosed manufacturing flow that facilitates growth of upright dielectric nanotubes having ultra low-k values that form all or part of the dielectric material for an ILD. The use of dielectric nanotubes as an ILD dielectric, as opposed to using traditional ultra low-k dielectric materials, which are typically mechanically soft, allows for improved planarization of ILD layers. In one embodiment, carbon nanotubes form interlayer conducting vias. In another embodiment Boron Nitride Nanotubes (BNNTs) are used as reinforcements for conventional dielectric materials such as porous Ultra-Low K (ULK) dielectric materials. Various embodiments of the present disclosure will be better understood with reference to FIGS. 1-42.

Figure 1:
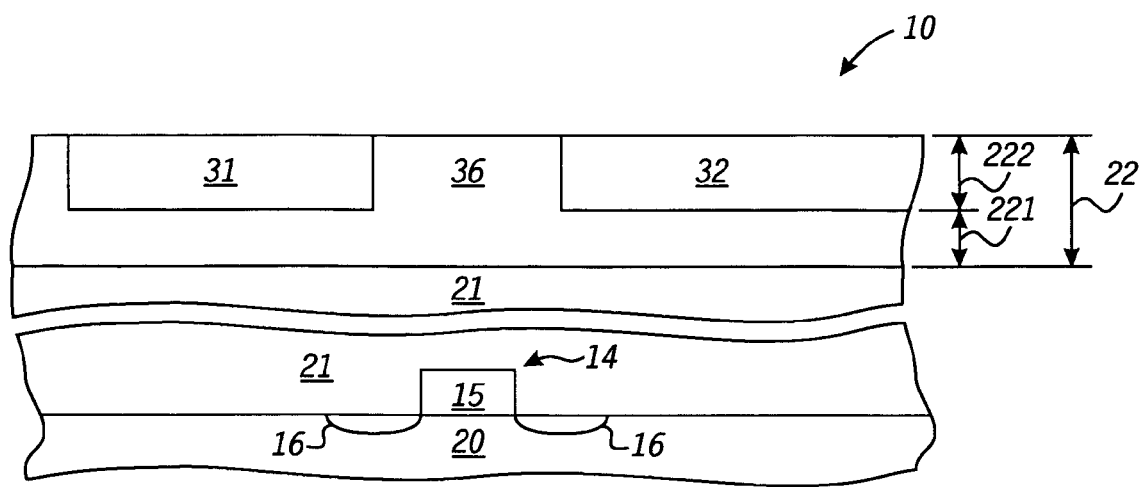
FIGS. 1-5, and 9-23 illustrate in cross section a semiconductor device workpiece at various manufacturing stages in accordance with a specific embodiment of the present disclosure.

FIG. 1 illustrates a workpiece 10 that includes substrate 20, intervening layers 21, and interconnect layer 22.

Substrate 20 is a base material. An example of a substrate includes a quartz plate, a monocrystalline semiconductor wafer, a semiconductor-on-insulator wafer, etc. The reference point for a substrate is the beginning point of a process sequence. A substrate in accordance with an embodiment of the present disclosure includes a single crystal semiconductor material portion at its surface, such as silicon or gallium arsenide.

Intervening layers 21 overly substrate 20 and will typically include multiple layers such as interconnect layers and layers used to form specific structures associated with electronic devices. A structure 14 is specifically illustrated as a portion of intervening layers 21 that includes gate structure 15 associated with source/drain regions 16. The various portions of intervening layers 21 are deposited and grown using conventional and proprietary techniques as are known in the art, as well as those techniques disclosed herein.

Interconnect layer 22 includes metal level 222 and via level 221. Metal level 222 is the level at which electric conductor lines 31 and 32 are located within a dielectric material 36 of interconnect layer 22. The electric conductor lines 31 and 32 are electrically conductive and have lengths that that typically run parallel to the major surface of the workpiece. For example, the view of electric conductor 31 in FIG. 1 is relative to its width, whereby its length runs into and out of the page containing FIG. 1. The view of electric conductor 32 is relative to its length, which runs left and right along the page containing FIG. 1. Dielectric material 36 forms the inter-level dielectric (ILD) portion of interconnect layer 22. It will be appreciated that while conductors 31 and 32 are illustrated as running orthogonally relative to the surface of the page, they may also run at non-orthogonal angles relative the page and to each other, such as at 45 degree angles relative to the page surface).

Via level 221 is the level at which vias (none illustrated in the cross-section illustrated in FIG. 1) are formed to electrically connect electric conductor lines at level 222 to structures, such as other electric conductor lines, at lower levels. Note that while it is possible for a via to pass through an interconnect layer without contacting an electric conductor of an abutting interconnect layer, for purposes of discussion, it is assumed all vias are used to electrically connect conductive structures of abutting interconnect layers, or to connect frontend-of-line structures to a first level of metal. Therefore, the term "via" or "via interconnect" is used broadly herein to include conductive structures that connect electric conductors (conductive structures) at different levels to one another. Examples of conductive structures at different levels that can be connected by a via included metal lines of interconnect layers, and front-end conductive structures, such as source, drain, and gate regions. Therefore, the term "via" and "via interconnect" as used herein includes structures typically referred to as "contacts" that connect front-end structures to overlying metal lines. It will be further appreciated that vias can include multiple layers. For example, a via can include a conductive liner material that acts as an interface between a dielectric layer and another conductive material.

Figure 2:
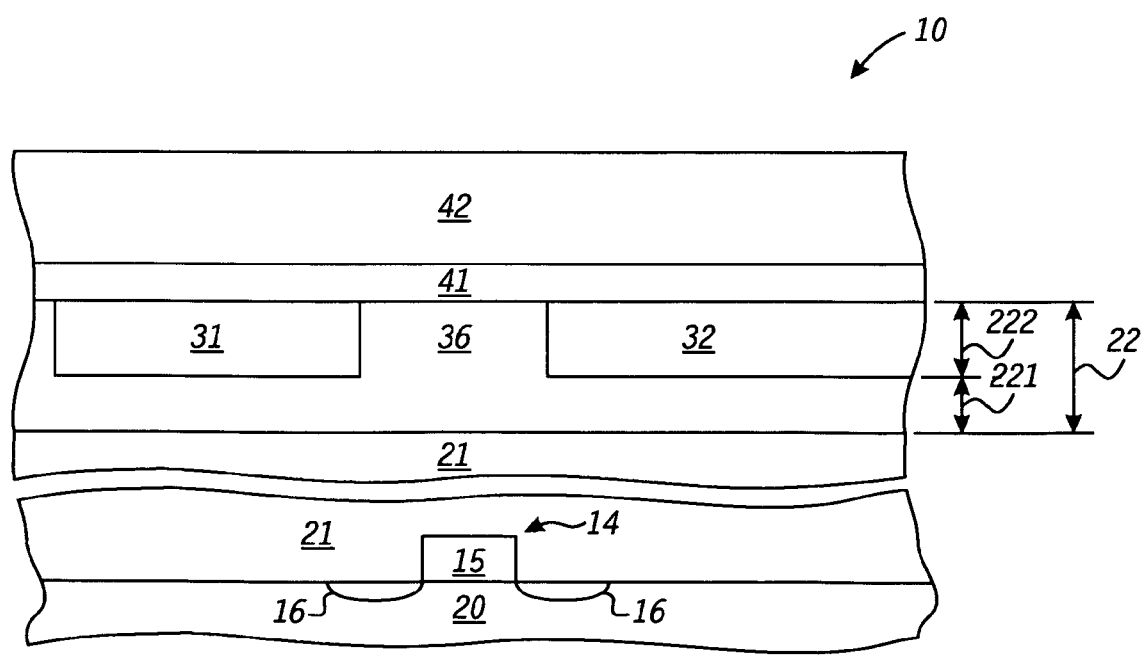

FIG. 2 illustrates workpiece 10 after formation of layers 41 and 42. Layers 41 and 42 will subsequently be patterned to function as a hardmask to facilitate subsequent catalyst deposition. Layer 41 overlies conductive interconnect layer 32, and can be formed by conventional and proprietary deposition and growth techniques as are known in the art. Layer 41 is formed from a material selected for use with layer 42 to be an etch stop layer that facilitates termination of processes used to remove portions of overlying layer(s).

Layer 42 is formed using a material suitable for formation of a mask to facilitate catalyst deposition as described further herein. Layer 42 can be formed by conventional and proprietary deposition and growth techniques known in the art. In one embodiment, layer 42 comprises an oxide, such as an oxide formed using TEOS (a TEOS layer or TEOS dielectric) or a nitride layer. It will be appreciated that etch stop layer 41 can be eliminated in alternate embodiments depending upon the specific materials and processes being implemented.

Figure 3:
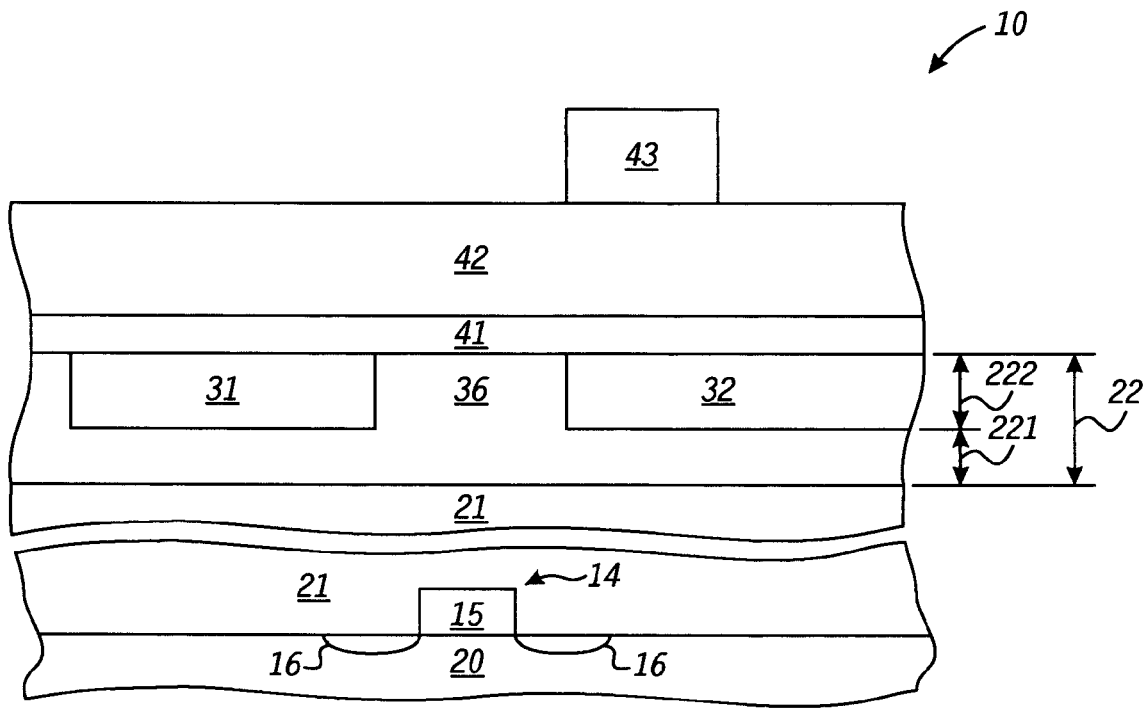

FIG. 3 illustrates workpiece 10 after formation and patterning of layer 43 that overlies layer 42. Layer 43 is a mask layer such as a photoresist material. Layer 43 can be formed using conventional or proprietary deposition and growth techniques known in the art. Locations of layer 42 masked by the material of layer 43 correspond to locations of via interconnects of an interconnect layer being formed. For example, a via interconnect will be formed at a location underlying the portion of layer 43 illustrated in FIG. 3. Once formed, this interconnect via will electrically connect electric conductor line 32 to an overlying conductive structure such as an electric conductor line. Locations of layer 42 that are not masked by the material of layer 43 are locations where ILD material will reside, i.e., location where there will be no via interconnects, in the resulting interconnect layer being formed. Therefore, electric conductor line 31 will not be electrically connected to a via interconnect at the cross-section location illustrated in FIG. 3.

Figure 4:
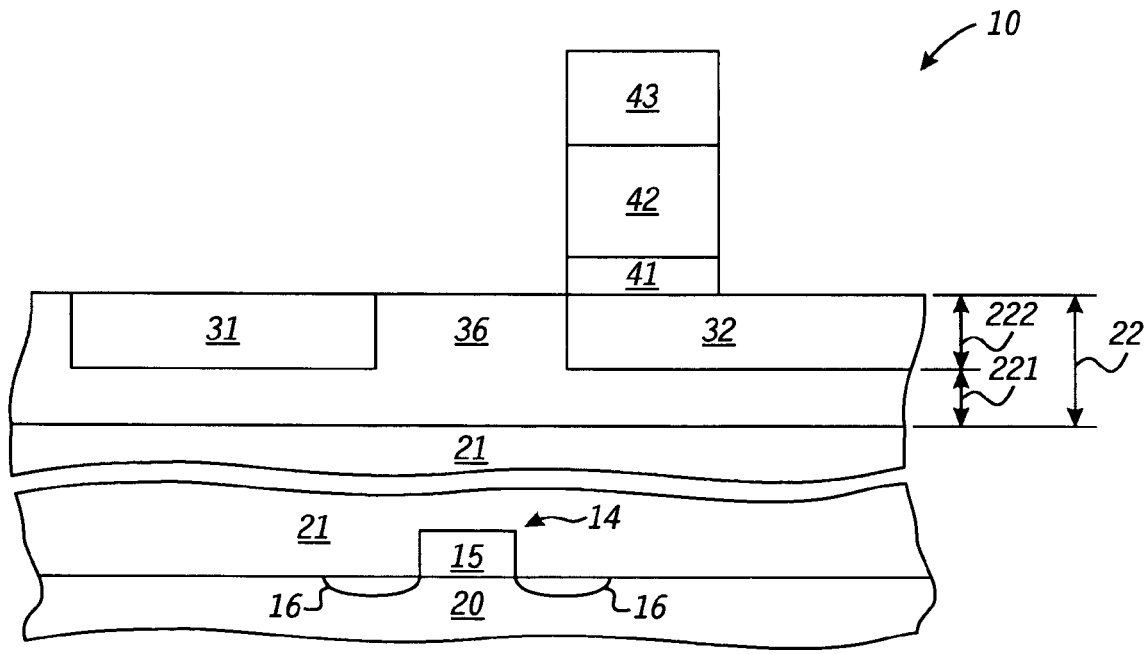

FIG. 4 illustrates workpiece 10 after removal of a portion of layer 42 and layer 41. Removal of the portion of layer 42 can be accomplished using conventional and proprietary etching techniques depending upon the material of layer 42. In one embodiment, the etch of layer 42 is terminated by detecting when the material of layer 41 is encountered. In an alternate embodiment, an etch process that selectively removes layer 42 relative to layer 41 can be used to facilitate the use of a timed etch of layer 41. Portions of layer 41 remaining after removal of layer 42 can be removed by continuing the etch process that removed layer 42 for a determined amount of time, or by applying an etch process that is different from the etch process that removes layer 42. In one embodiment, the etch process that removes layer 42 is continued for a specified amount of time subsequent to detection of the material of layer 41.

Figure 5:
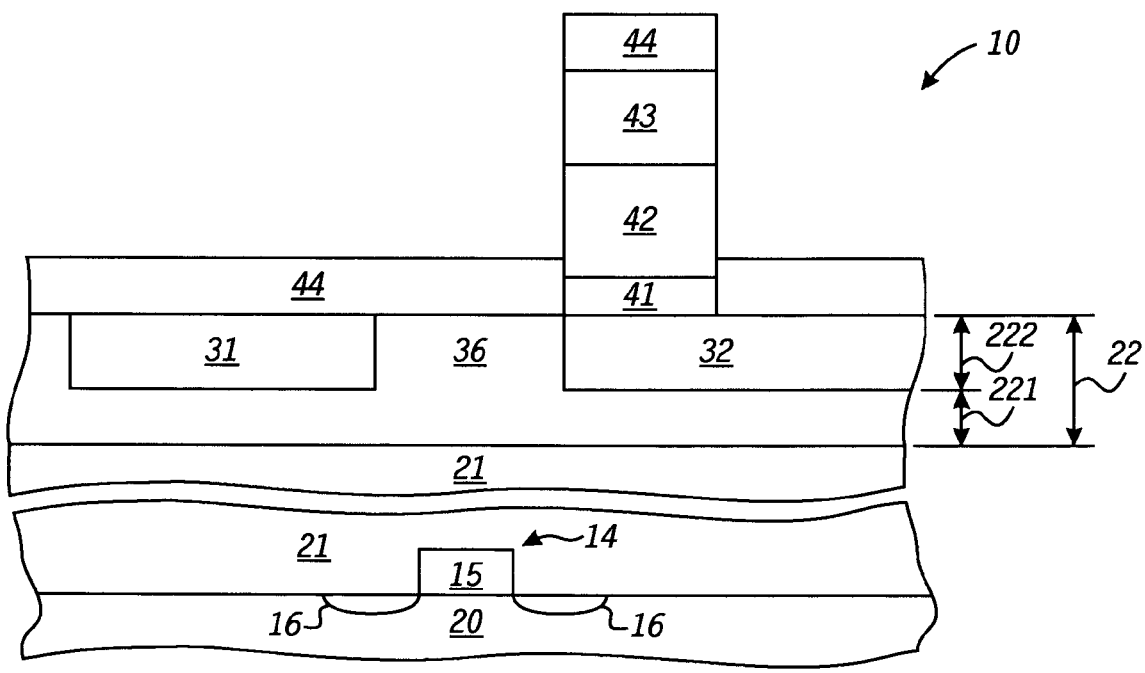
Figure 6:
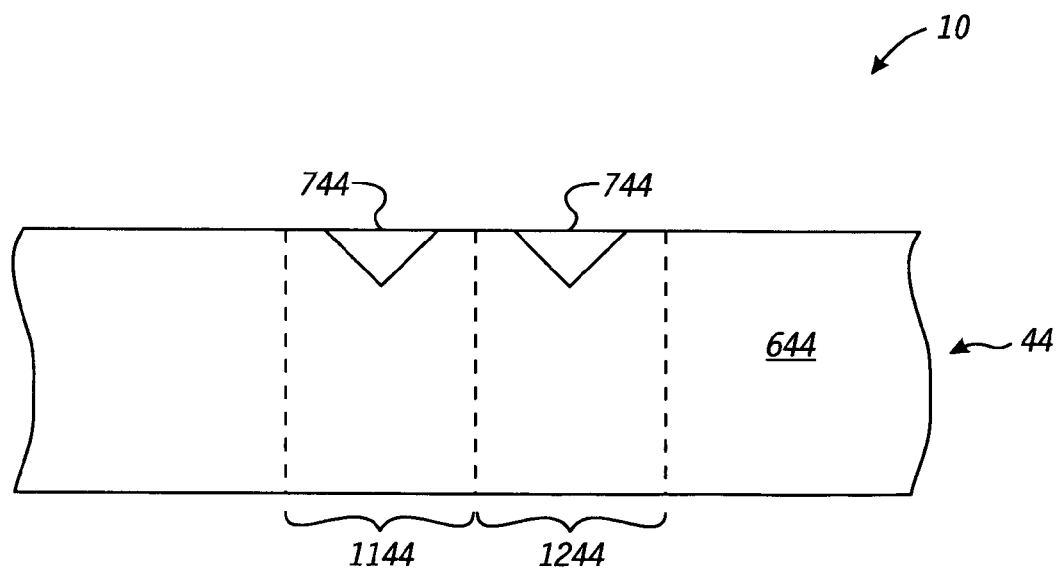
FIG. 6 illustrates a composite catalyst layer formed in accordance with a specific embodiment of the present disclosure.
Figure 7:
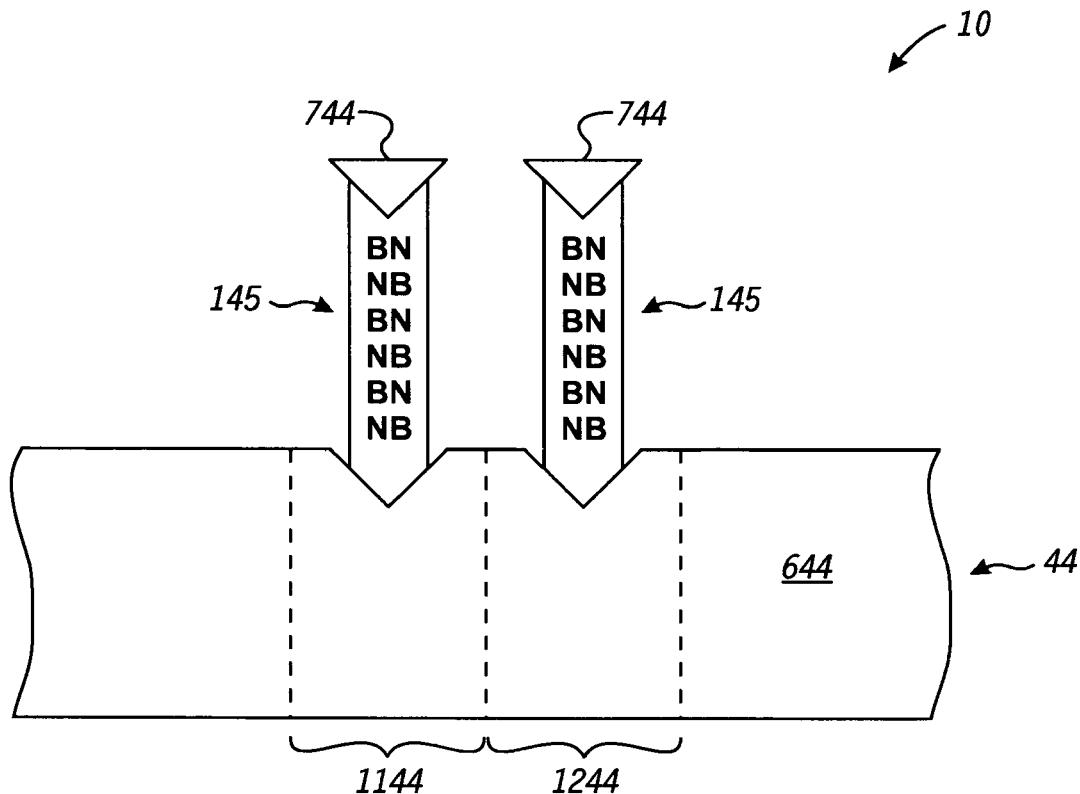
FIG. 7 illustrates nanotube formation using a tip-seed composite catalyst in accordance with a specific embodiment of the present disclosure.

FIG. 5 illustrates workpiece 10 after formation of layer 44. Layer 44 is a composite catalyst layer formed using conventional and proprietary deposition or growth techniques known in the art. The term composite catalyst is a term used to indicate material having a plurality of composite portions including a catalyst and a material. For example, the material of layer 44 comprises a plurality of composite portions each of which include a supporting dielectric portion and an active catalyst portion that facilitate subsequent formation of dielectric nanotubes (DNTs) such as boron nitride nanotubes (BNNTs). In one embodiment, the catalyst portions of each composite portion of layer 44 are electrically isolated from adjacent catalyst portions by their respective dielectric portions. For example, FIG. 6 illustrates composite portions 1144 and 1244 of layer 44. Each composite portion 1144 and 1244 includes a dielectric portion 644 and a catalytic portion 744. In accordance with one embodiment, illustrated in FIG. 7, the composite portions 1144 and 1244 are "tip-seed composite catalysts", which is a term used to indicate that a catalyst portion 744 remains at the "tip" of a DNT that is formed between the dielectric portion 644 and the catalyst portion 744, e.g., formation of a DNT that underlies the catalyst portion 744 occurs.

Figure 8:
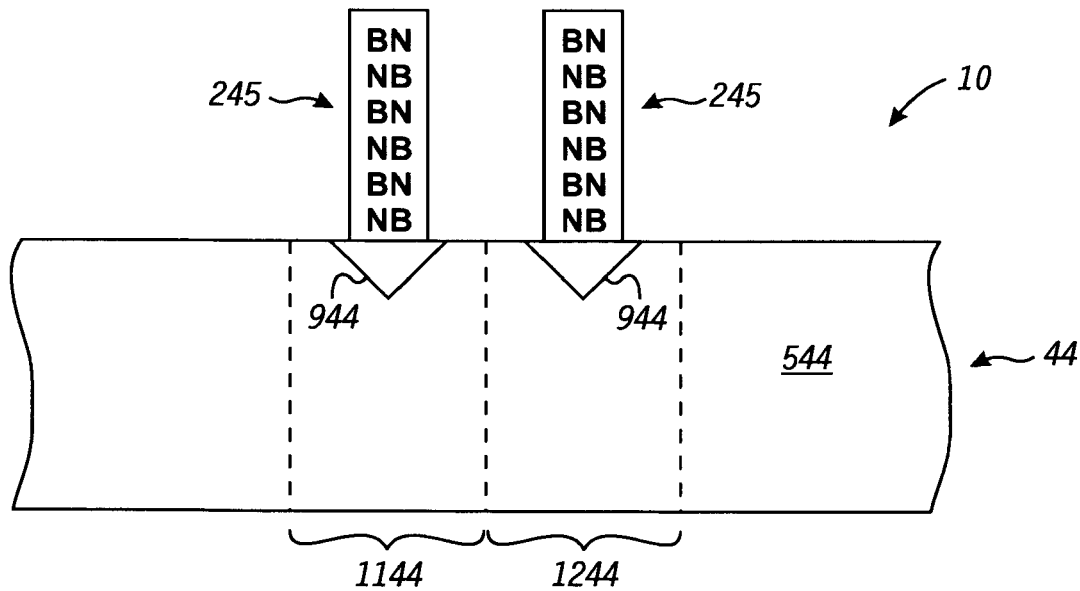
FIG. 8 illustrates nanotube formation using a root-seed composite catalyst in accordance with a specific embodiment of the present disclosure.

In an alternate embodiment, illustrated in FIG. 8, the composite portions 1144 and 1244 can be "root-seed composite catalysts", which is a term used to indicate that the catalyst portions 944 each facilitate formation of DNTs overlying the catalyst portion 944, while the catalyst portions 944 remain with the dielectric portion 544. This results in a catalyst portion 944 staying at the "root" of a DNT being formed. The use of a composite catalyst to form layer 44 is advantageous over the use of a traditional catalyst layer that does not have a dielectric portion because traditional catalyst materials are typically conductive, thereby facilitating undesirable electrical shorting along the catalyst layer when electrically insulating nanotube layers are desired. Note that the composite portions forming layer 44 can be separate structures or portions of a continuous layer that includes isolated catalyst portions.

Figure 9:
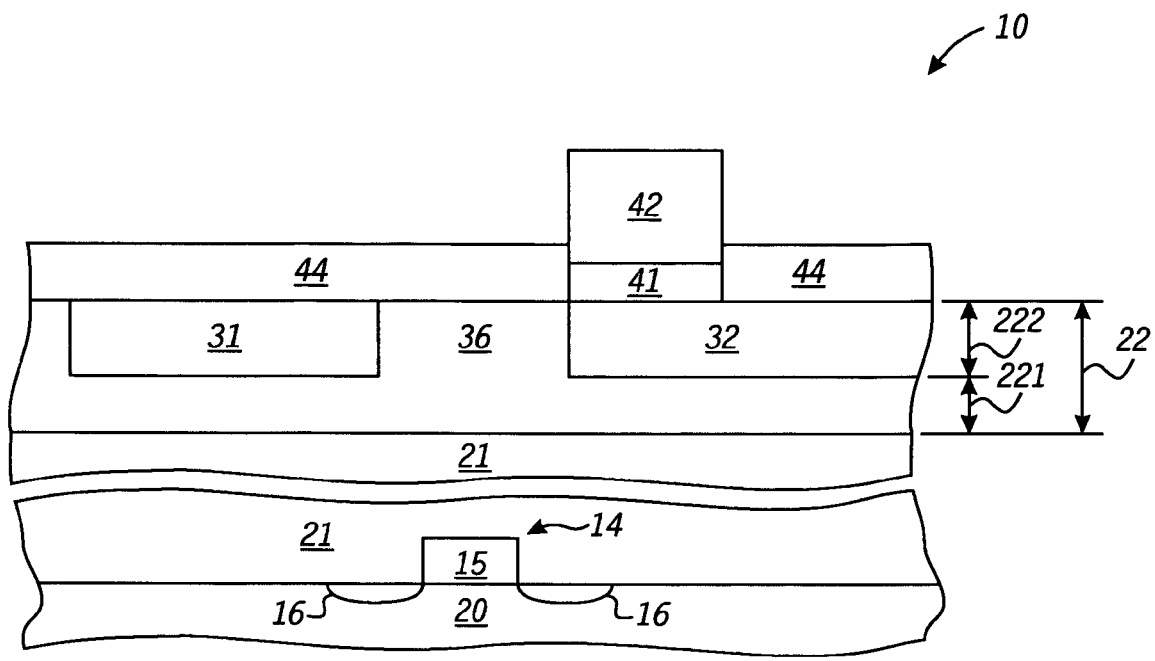

FIG. 9 illustrates workpiece 10 subsequent to removal of layer 43 and the portion of layer 44 illustrated in FIG. 5 as overlying layer 43. An etch that preferentially removes layer 43 relative to layer 44 is used to remove layer 43. As a result of removing layer 43, a "lift off" of the portions of layer 44 overlying layer 43 occurs without removing the desirable portions of layer 44, i.e. those portions of the workpiece 10 where the DNTs are to be formed. Therefore, conventional and proprietary etches as are known in the art can be used to selectively etch layer 43 relative to layer 44, such that layer 44 is not etched by the etch process. For example, assuming layer 43 comprises a photoresist material, an etch that ashes the photoresist can be performed. By removing layer 43 in this matter, the undesirable portions of layer 44 that overly layer 43 and 42 are "lifted off", while the desirable portions of layer 44 remain.

It will be appreciated that a lift-off of layer 44 can be accomplished by selectively removing any layer underlying the portion of layer 44 to be lifted-off. For example, an etch that preferentially removes layer 42 relative to layer 44 can be used to remove layer 42 and "lift off" layer 43 and portions of layer 44 overlying layer 43 without removing the desirable portions of layer 44, i.e. those portions of the workpiece 10 where the DNTs are to be formed. Therefore, an etch is performed that selectively etches layer 42 relative to layer 44, such that layer 42 is removed. For example, assuming layer 42 comprises an oxide, such as a silicon oxide, conventional and proprietary etches known in the art can be performed. By removing layer 42 in this manner, the undesirable portions of layer 44 that overly layer 43, and therefore layer 42, are "lifted off", while the desirable portions of layer 44 remain.

Figure 10:
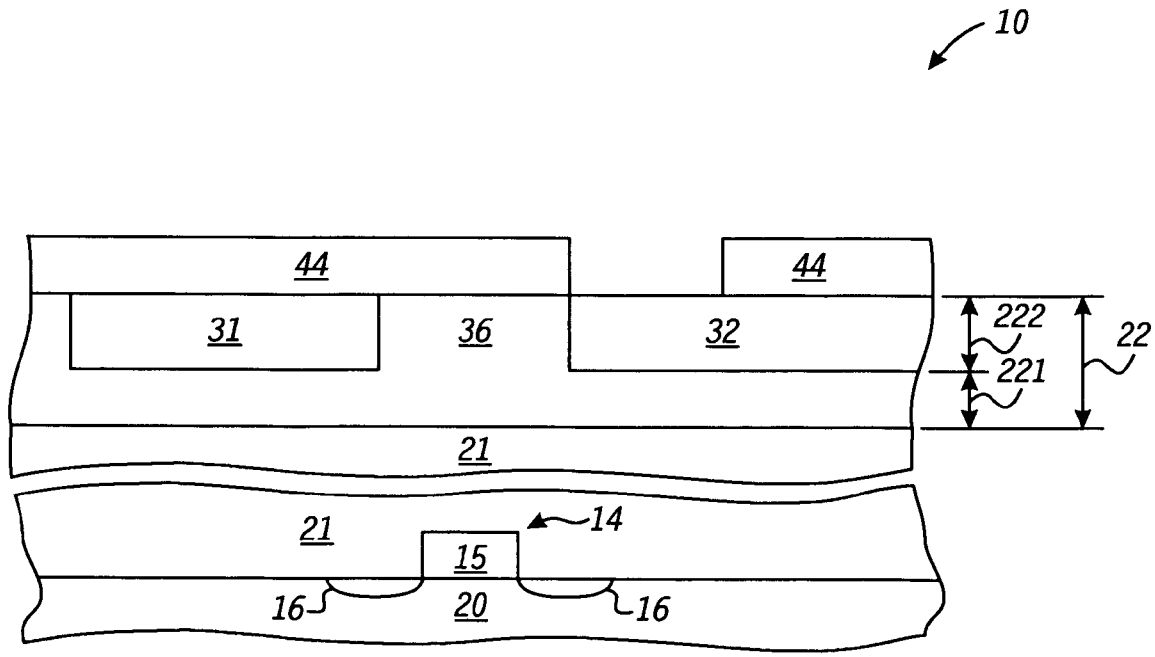

FIG. 10 illustrates an embodiment whereby workpiece 10 is illustrated subsequent to removal of layers 42, 43, the portion of layer 44 illustrated in FIG. 5 as overlying layer 43, and the remaining portion of layer 41 underlying layer 42. It will be appreciated that because subsequent dielectric nanotube formation occurs only at layer 44, that removal of layers 42 and 41 will not result in dielectric formation at the location where a via is to be formed. The remaining portion of layer 41 can be removed using an etch process that preferentially removes the material of layer 41 relative to the material of layer 44. The etch that removes layer 41 can be the same or different than the etch process used to remove layer 42. Note that it is anticipated that layer 41 or both layers 41 and 42 can remain during subsequent nanotube formation.

Figure 11:
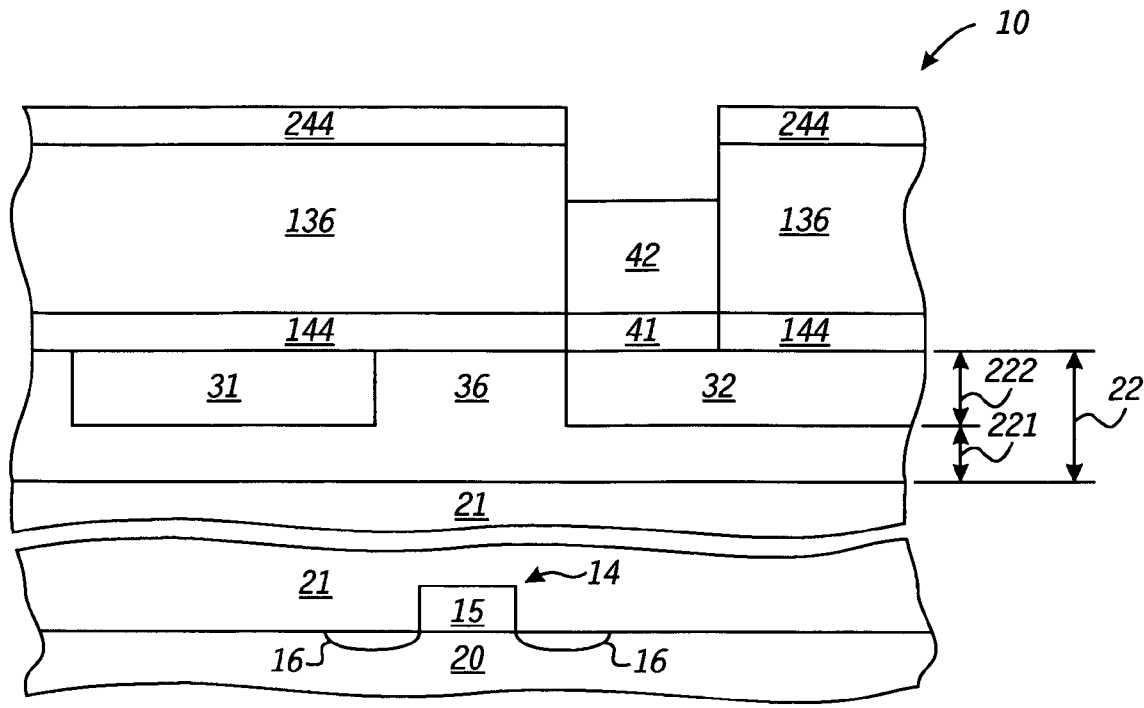

FIG. 11 illustrates workpiece 10 subsequent to formation of layer 136 overlying the workpiece of FIG. 9. Layer 136 includes a plurality of upright DNTs overlying layer 144 in an upright manner, i.e. a plurality of dielectric nanotubes a majority of which are upright dielectric nanotubes formed using conventional growth and deposition techniques as are known in the art. In a particular embodiment, substantially all DNTs of layer 136 are upright DNTs. Layer 144 represents the dielectric portion, i.e., support, portions, of composite catalyst layer 44 that remains when layer 44 is a tip-seed composite catalyst. Layer 244 represents the catalyst portions of the composite catalyst layer 44 that remain at the tip of their respective DNTs. Substantially all of the DNTs of layer 136 are considered "upright", or "upright DNTs" because they are formed substantially perpendicular to the major surface of the workpiece. In one embodiment, the DNTs are boron nitride nanotubes (BNNTs) grown by forming a plasma dissociating borazine over a deposited composite catalyst layer having a catalyst portion that includes one or more of the metals including Fe, Ni, Co, Mo, Pt, or other materials, embedded in a support portion comprising one or more of alumina (alpha-$Al_2O_3$), $SiO_2$, $TiO_2$, low-k dielectric constant zeolites, or the like. The support and the catalyst material separate as the co-mingled catalyst and borazine product nanotube precursor bond more strongly together than do the support and catalyst.

Figure 12:
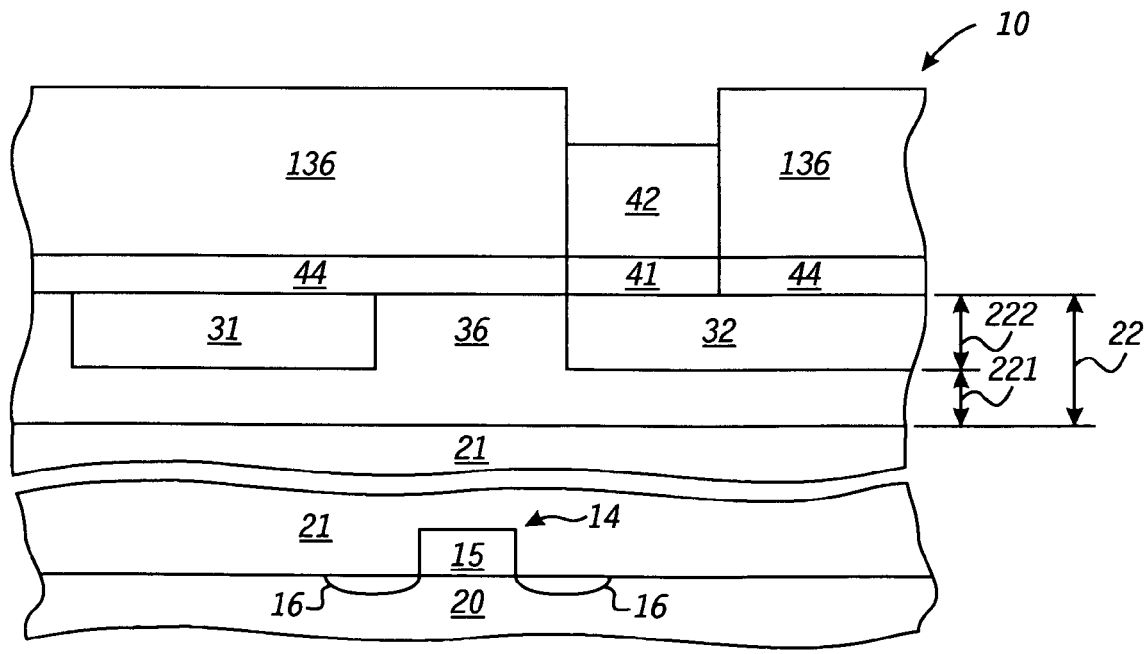

FIG. 12 represents an alternate embodiment from that that illustrated in FIG. 11, whereby layer 44 is a root-seed composite catalyst that allows DNT layer 136 to be formed overlying the catalyst portion of composite catalyst layer 44. In one embodiment, the DNTs are boron nitride nanotubes (BNNTs) grown by forming a plasma dissociating borazine over a deposited layer of catalyst. A root-seed composite catalyst layer can be achieved using nickel boride embedded in a dielectric support. Nickel boride catalyzes the growth of BNNTs through a surface reaction. As such the active catalyst of layer 44 is not removed from the dielectric support portion. Alternatively, plasma dissociated borazine precursors can be allowed to impinge on simple metal (e.g., Co) catalysts dispersed such that they so not form an electrically conducting layer.

Figure 13:
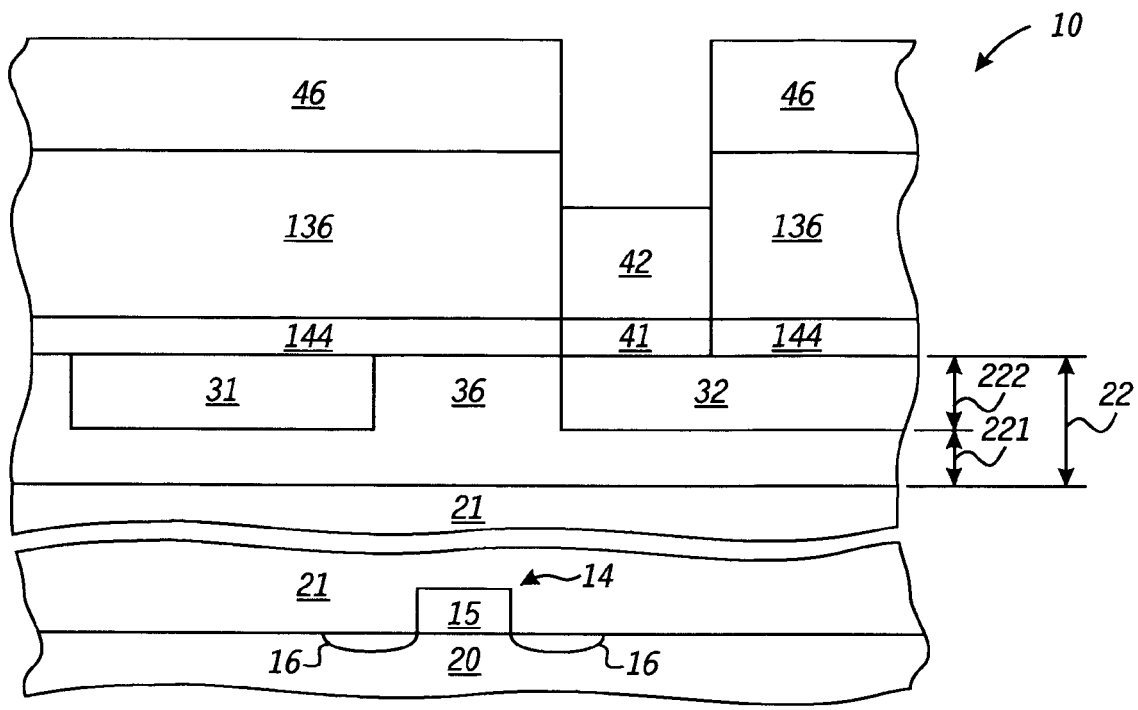

FIG. 13 illustrates workpiece 10 subsequent to forming layer 46 on the workpiece illustrated in FIG. 11. Note that because layer 244 comprising the catalyst used to form layer 136 can be exhausted during formation of layer 136, layer 244 is not specifically illustrated. Alternatively, some or all of layer 244 can remain, though not specifically illustrated. Layer 46 isolates, and thereby protects, layer 136 from subsequent processes. For example, where conductive nanotubes (CNTs) are to be subsequently formed, layer 46 can used to assure CNT growth does not occur at DNT locations where catalyst material remains. Layer 46 can be an oxide, nitride, or other suitable material and can be formed using conventional and proprietary deposition and growth techniques as are known in the art. In a specific embodiment layer 46 is a photoresist. Note that layer 46 may not be needed if the catalyst used to form the DNTs is exhausted during DNT formation. In another embodiment, layer 46 may not be needed even when the catalyst used to form the DNTs is not exhausted, provided that subsequent CNT formation occurs overlying the DNT layer 136 if the workpiece is to be subsequently planarized to an extent that results in the removal of any CNT formation overlying the DNT formation.

Figure 14:
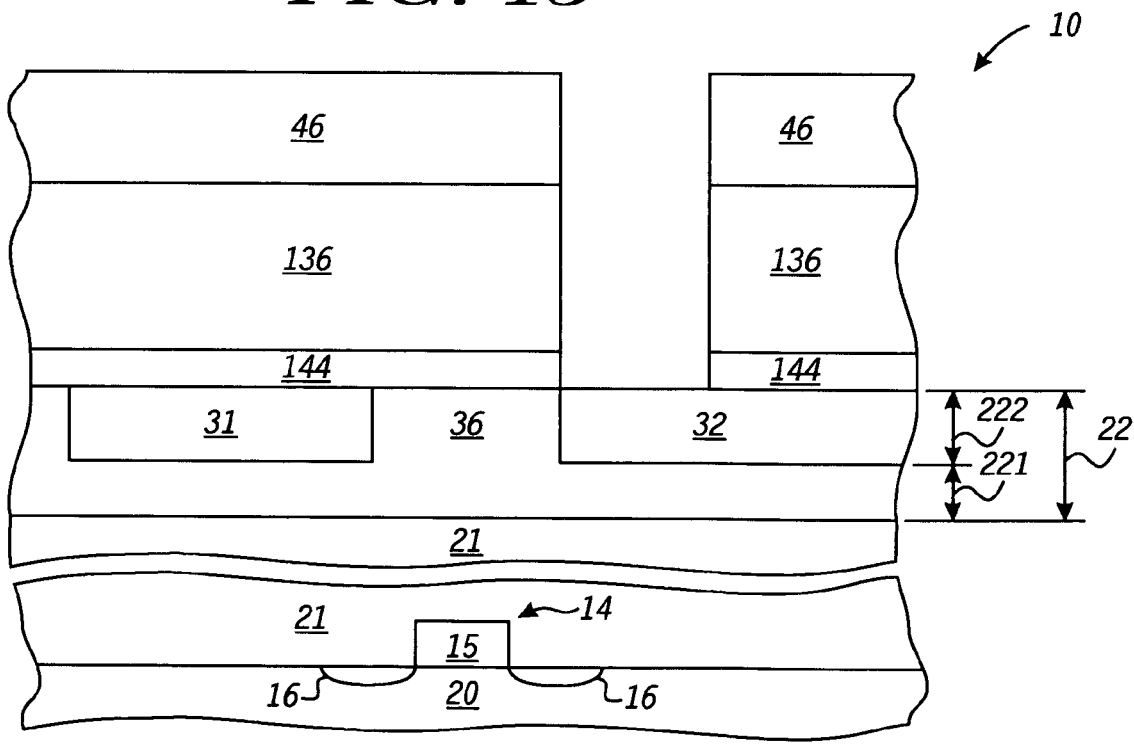

FIG. 14 illustrates workpiece 10 subsequent to removal of remaining portions of layers 41 and 42 using a conventional and proprietary etch process as are known in the art. Removal of the remaining portions of layer 42 and 41 result in formation of a via opening to overlying conductive structure 32.

Figure 15:
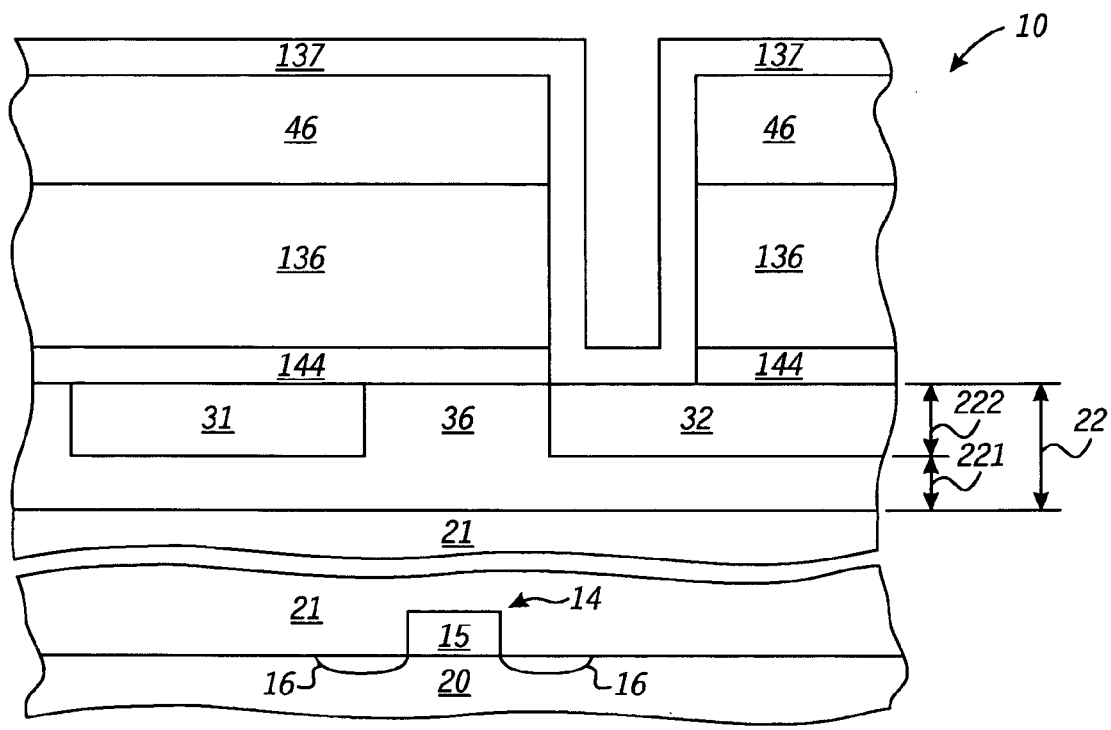

FIG. 15 illustrates workpiece 10 after formation of layer 137 using conventional and proprietary deposition and growth processes as are known in the art. In one embodiment, layer 137 acts as a barrier portion of a via being formed, and provides an interface between layers 32, 141, and 136 and an overlying conductive layer of the viato be subsequently formed. For example, if a copper via interconnect is to be subsequently formed, layer 137 can include one or more of Ta, TaN, Ru, and the like. In one embodiment, layer 137 is conductive to facilitate an electrical connection between subsequently formed via interconnects and the underlying conductive portion 32. Alternatively, layer 137 can be a dielectric, such as BCN used to prevent diffusion through the DNT layer 136 during copper deposition, assuming a copper via interconnect is to be formed. In this embodiment, the portion of layer 137 at the bottom of the via interconnect opening will need to be removed, such as through the use of a sputter etch, to assure the ability to subsequently form an electrical contact to the underlying electrical conductor line 32.

Figure 16:
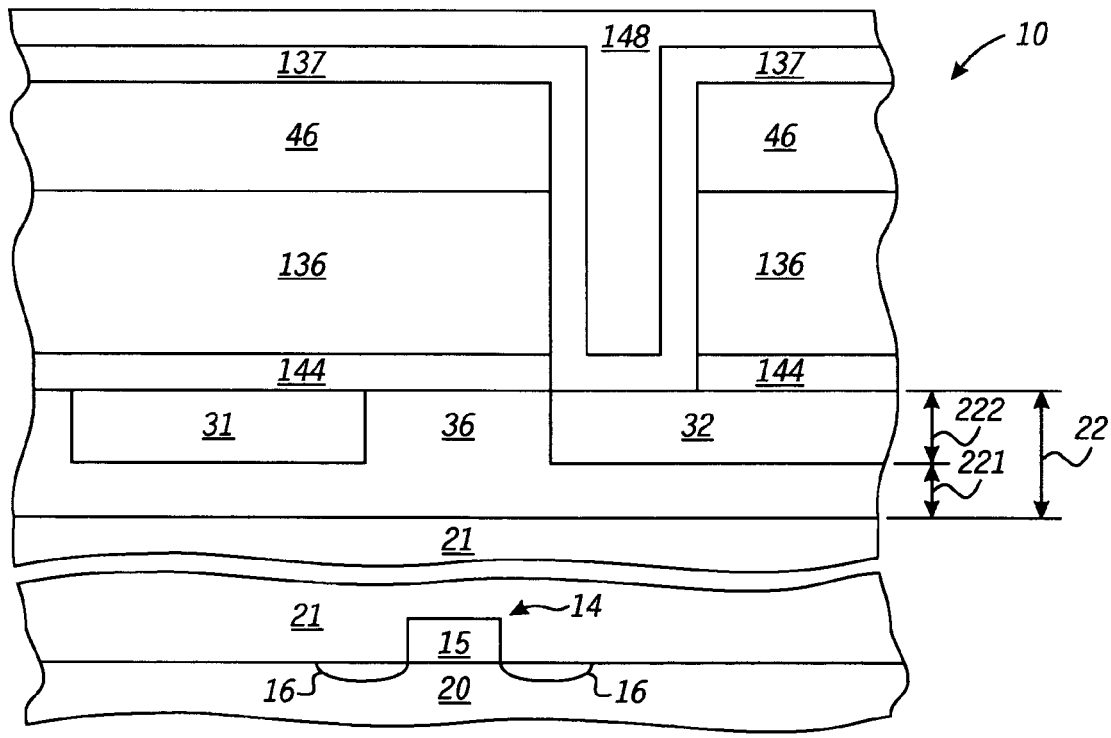

FIG. 16 illustrates workpiece 10 after formation of layer 148 over a conductive layer 137. Layer 148 is a conductive material from which a conductive via will be formed, and can be deposited or grown using conventional and proprietary techniques that are known in the art. Conductive materials from which layer 148 can be formed include copper, aluminum, and the like.

Figure 17:
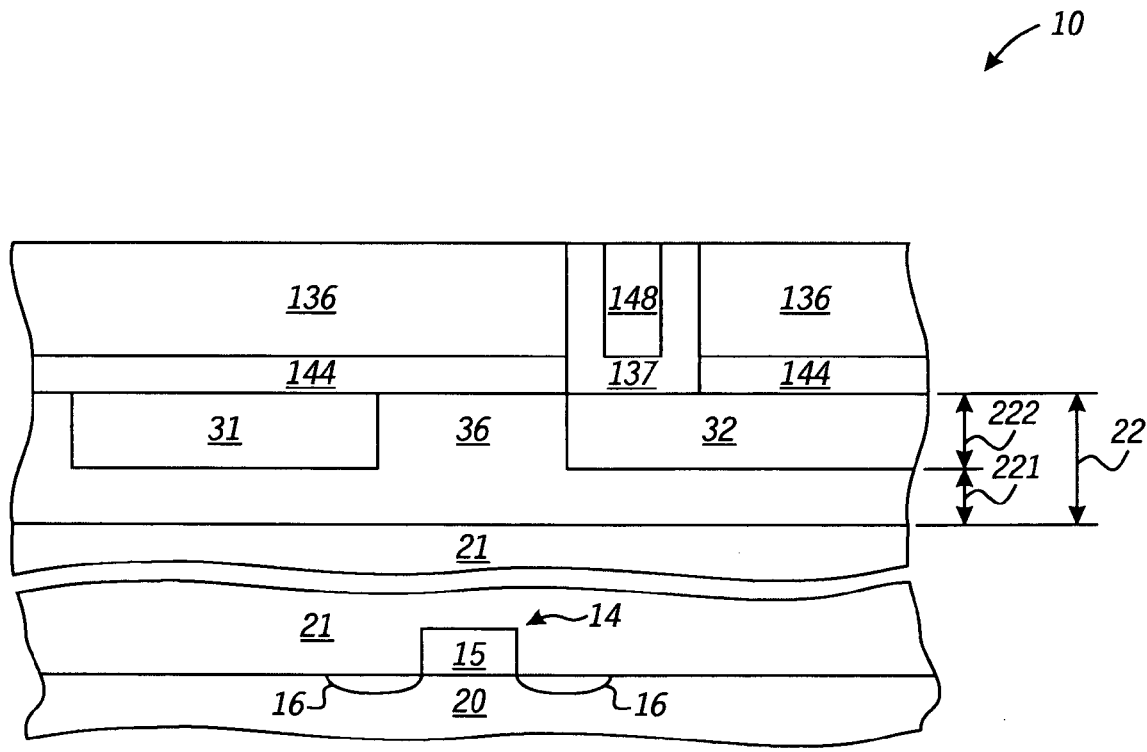

FIG. 17 illustrates workpiece 10 after planarization of the surface of workpiece 10 that removes portions of layers 148, 136, and 137. Planarization of workpiece 10 can be accomplished using conventional and proprietary mechanical and chemical polishing and etch techniques, such as chemical mechanical polishing (CMP) techniques. Planarization facilitates formation of a conductive via from remaining portions of layers 148 and 137 to form an electrical contact to conductive portion 32 of interconnect layer 21. Because DNTs, such as BNNTs, are harder than traditional ULKs, improved planarization can be realized, as well as improved ULK characteristics, such as a lower k-value.

Figure 18:
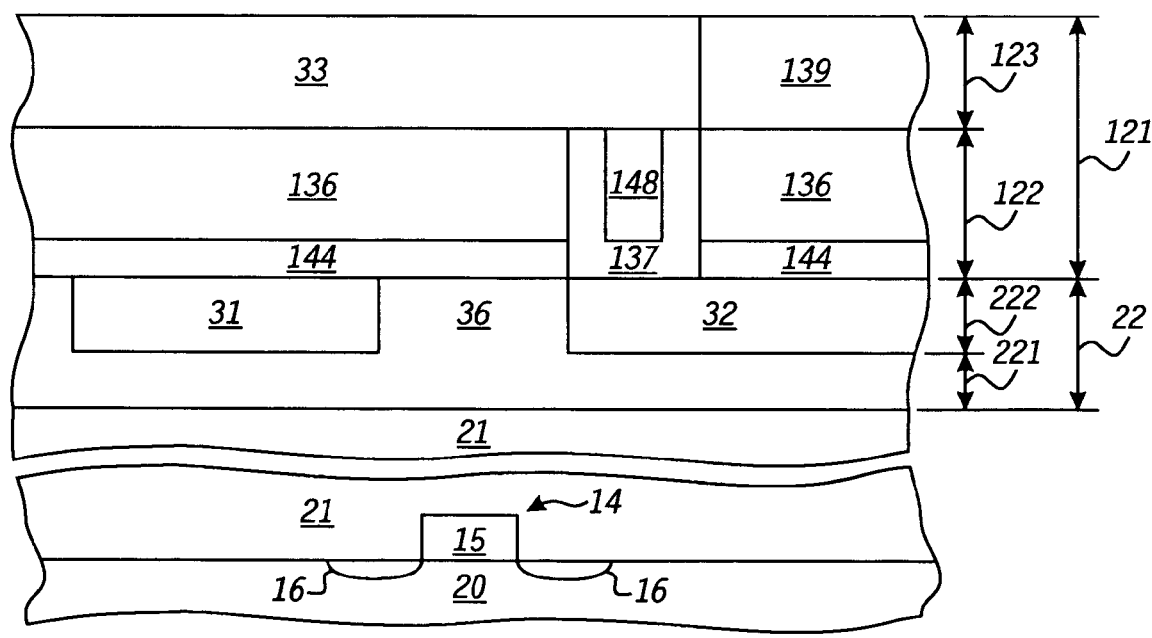

FIG. 18 illustrates workpiece 10 after formation of a subsequent metal level 123 that includes electric conductor line 33. Specifically, metal (conductive interconnect) level 123 and via level 122 are part of interconnect layer 121. Electric conductor line 33 is formed overlying and electrically connected to via that includes material 148. It will be appreciated that conductive portion 33 can be formed using the same or different material that as the remaining portion of layer 148 that forms via 138, and that electric conductor line 33, like other specifically numbered elements disclosed herein, can include multiple layers. For example, electric conductor line 33 can include one or more interfacial layers.

In an alternate embodiment, vias comprising CNTs are formed instead of traditional copper and aluminum vias. One integration flow, in accordance with a specific embodiment, for forming CNT vias performs processes similar to those described previously with respect to FIGS. 1-5 and 9-14, followed by CNT integration processes as illustrated in FIGS. 19-23, and can use plasma processes such as those used to dissociate hydrocarbon precursors are particularly conducive to generating upstanding CNTs.

Figure 19:
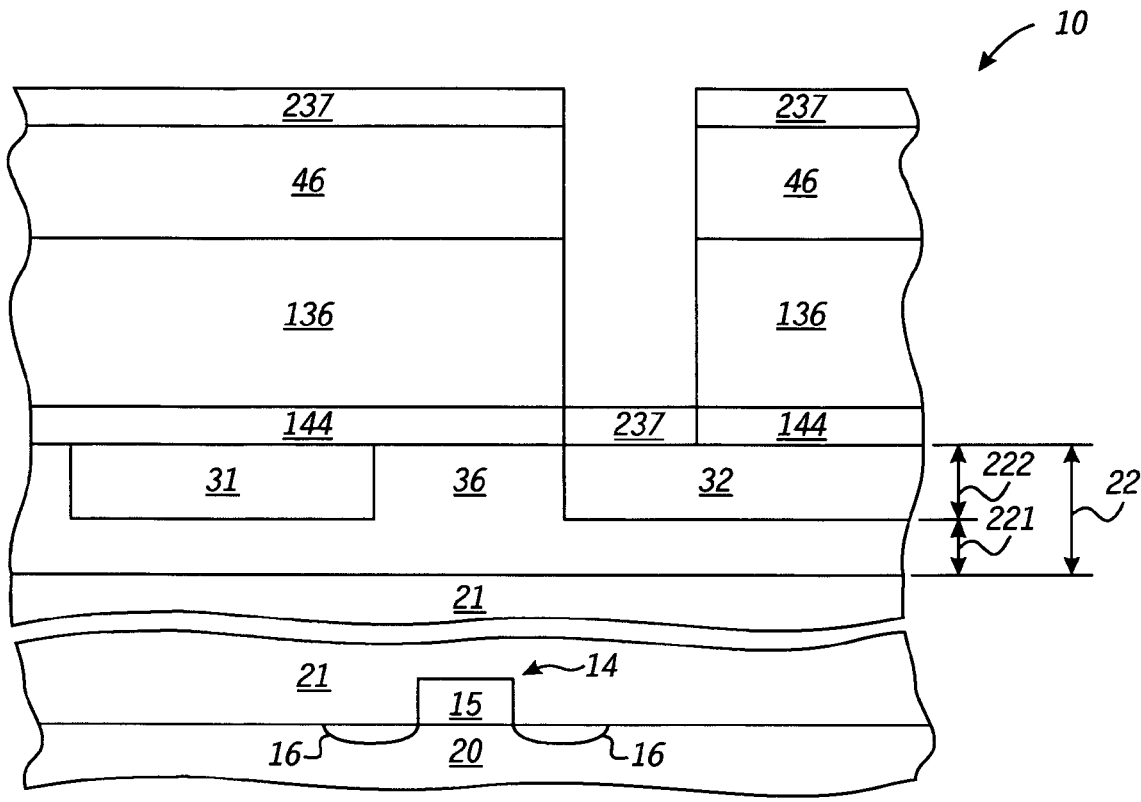

FIG. 19 illustrates layer 237 forming a layer overlying layers 46 and 32. The material of layer 237 selected to be a catalyst that facilitates formation of a conductive nanotube (CNT), such as a carbon nanotube (cCNT). In various embodiments, layer 237 is Platinum (Pt) that will typically include a barrier layer, such as a polymer, to provide a barrier for a hydrocarbon species used as a precursor. The barrier layer should also have the property of being a good electrical contact to cCNTs.

Figure 20:
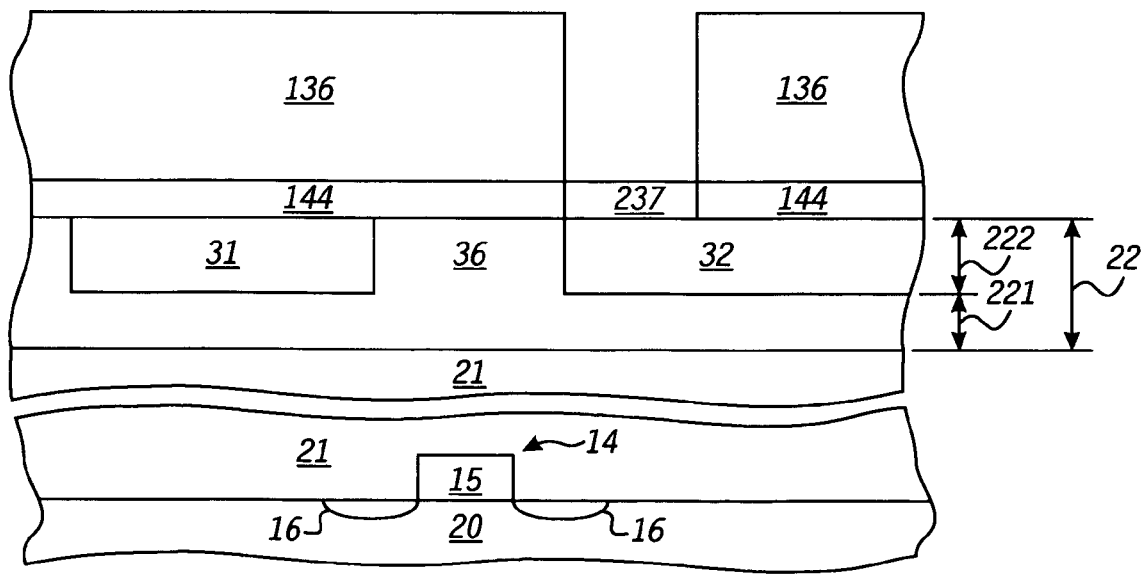

FIG. 20 illustrates the workpiece 10 after removal of layer 46 and those portions of layer 237 overlying layer 46. An etch process that is preferentially selective to the material of layer 46 can be used to lift off those portions of layer 237 overlying layer 46. The portion of layer 237 remaining at the bottom of opening that abuts conductor 32 defines the location where conductive nanotubes will be grown to form interconnect vias. Because the catalyst layer 46 is used to form a conductive structure, e.g., a via, the use of a composite catalyst in not needed.

Figure 21:
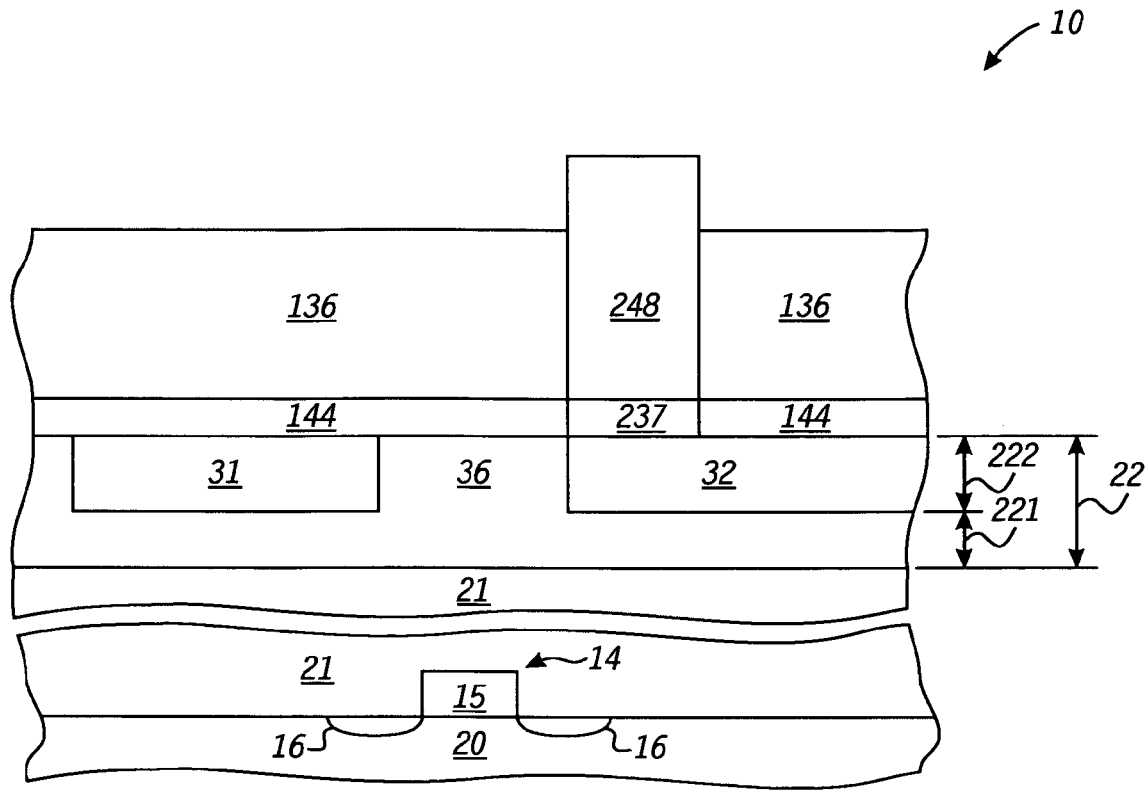

FIG. 21 illustrates workpiece 10 subsequent to formation of layer 248. Layer 248 comprises conductive nanotubes that are electrically connected to conductive portion 32.

Figure 22:
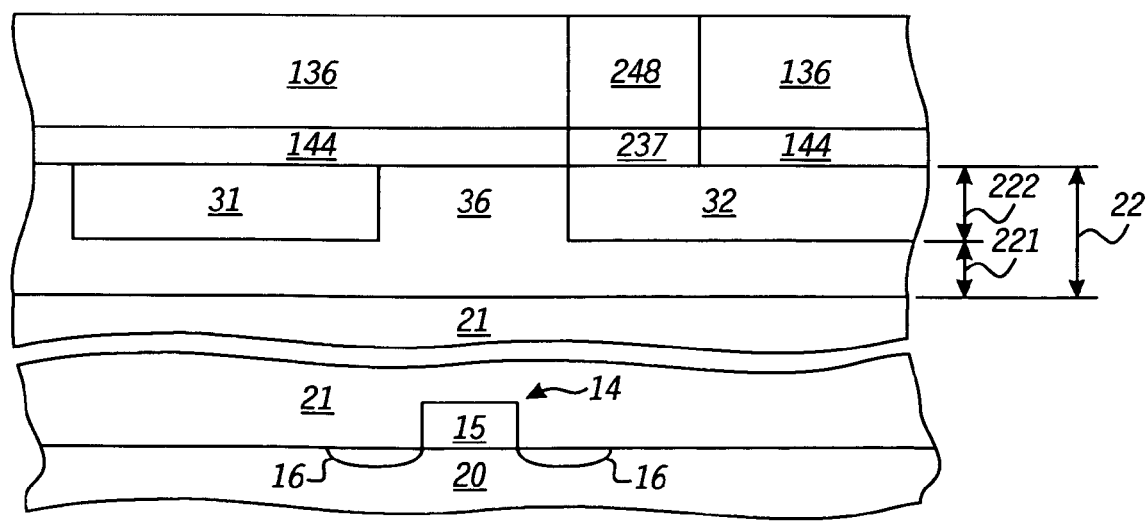

FIG. 22 illustrates workpiece 10 subsequent to a planarization process, such as a mechanical or chemical mechanical polishing process. In one embodiment, conventional and proprietary planarization processes are used to planarize silicon dioxide are anticipated.

Figure 23:
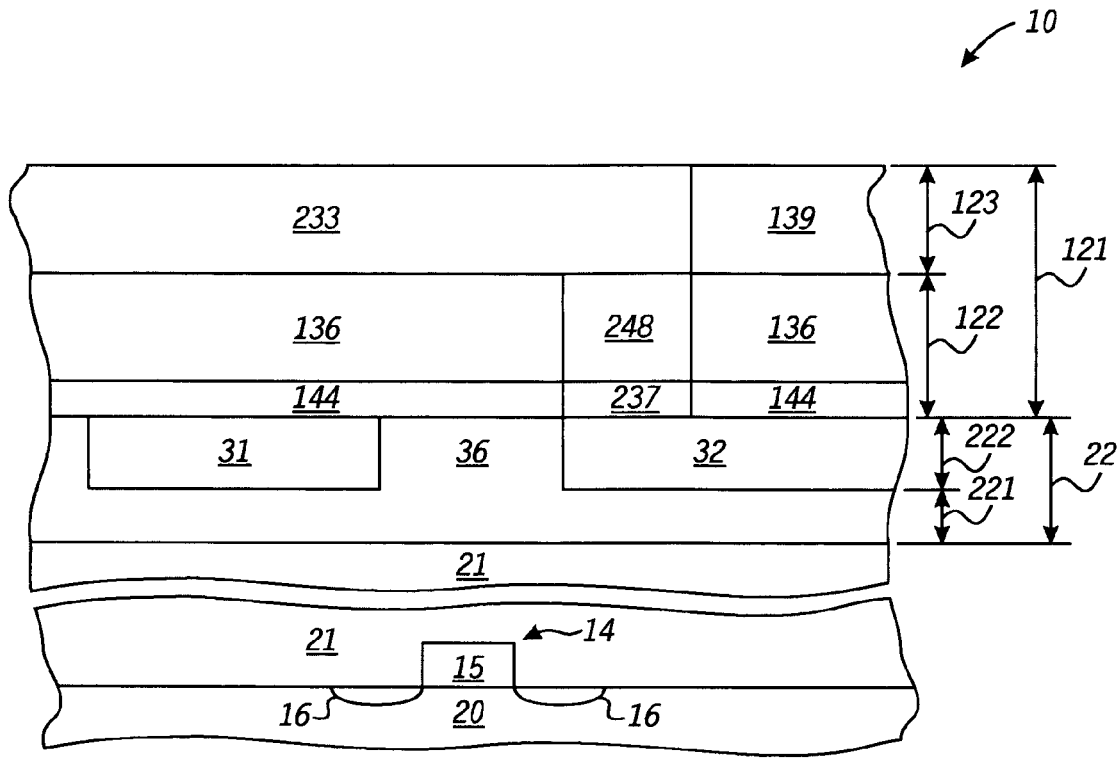

FIG. 23 illustrates workpiece 10 after formation of a subsequent metal level 123 that includes electric conductor line 233 and surrounding dielectric material 239. Specifically, metal level 123 and via level 122 are part of interconnect layer 121, as illustrated in FIG. 23. Electric conductor line 233 is formed overlying and electrically connected to via 248. It will be appreciated that electric conductor line 233 can be formed using the same or different material than that forming via 238, and that electric conductor line 233, like other specifically numbered elements disclosed herein, can include multiple layers. For example, electric conductor line 233 can include one or more interfacial layers. In one embodiment, a conductive interfacial layer can be formed at interconnect via 248 to facilitate formation of the electric conductor line 233. In one embodiment, electric conductor line 233 includes at least one metal, such as Aluminum, copper, or the like.

FIGS. 24-32 illustrate an alternate embodiment of the present disclosure whereby columns of DNTs are formed at portions of an interconnect layer instead of at the entire DNT layer as previously discussed.

Figure 24:
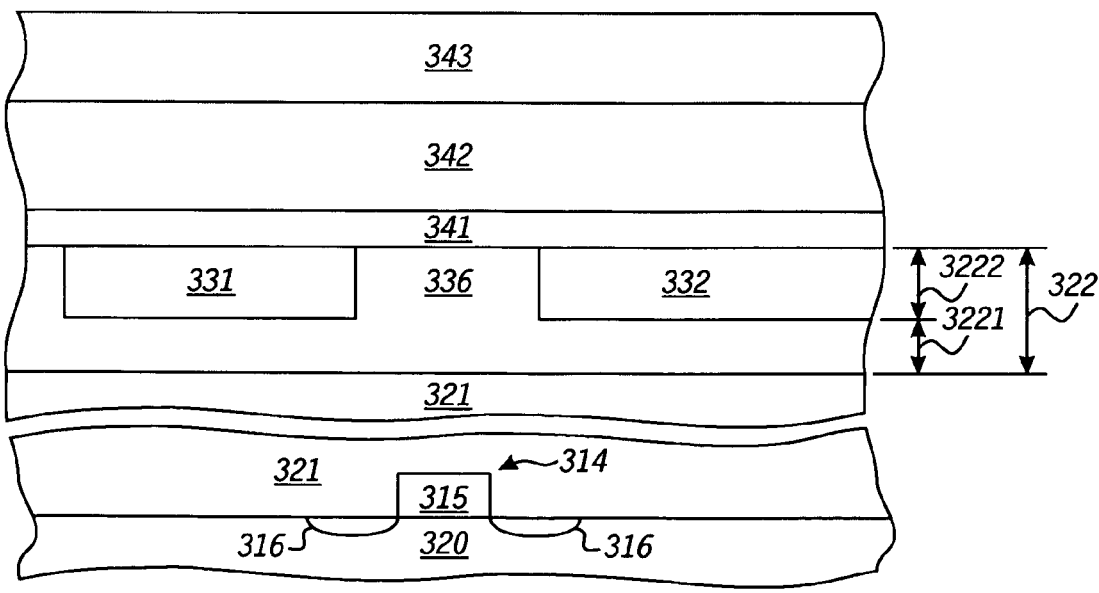
FIGS. 24-33 illustrate in cross section a semiconductor device workpiece at various manufacturing stages in accordance with an alternate embodiment of the present disclosure.

FIG. 24 illustrates a workpiece 30 at a similar stage of processing as that described with respect to FIG. 3, but prior to patterning of layer 343. In one embodiment, workpiece 30 includes a substrate 320 similar to substrate 20, intervening layers 321 similar to intervening layers 21, layer 341 similar to layer 41, dielectric material 336 similar to dielectric material 36, and electric conductors 331 and 332 similar to conductors 31 and 32. Additional elements corresponding to elements of FIG. 3 include layer reference 322 that includes levels 3222 and 3221, structure 314 that includes gate structure 315, and source/drain regions 316. In one embodiment, layer 343 is a photoresist layer that has not yet been patterned.

Figure 25:
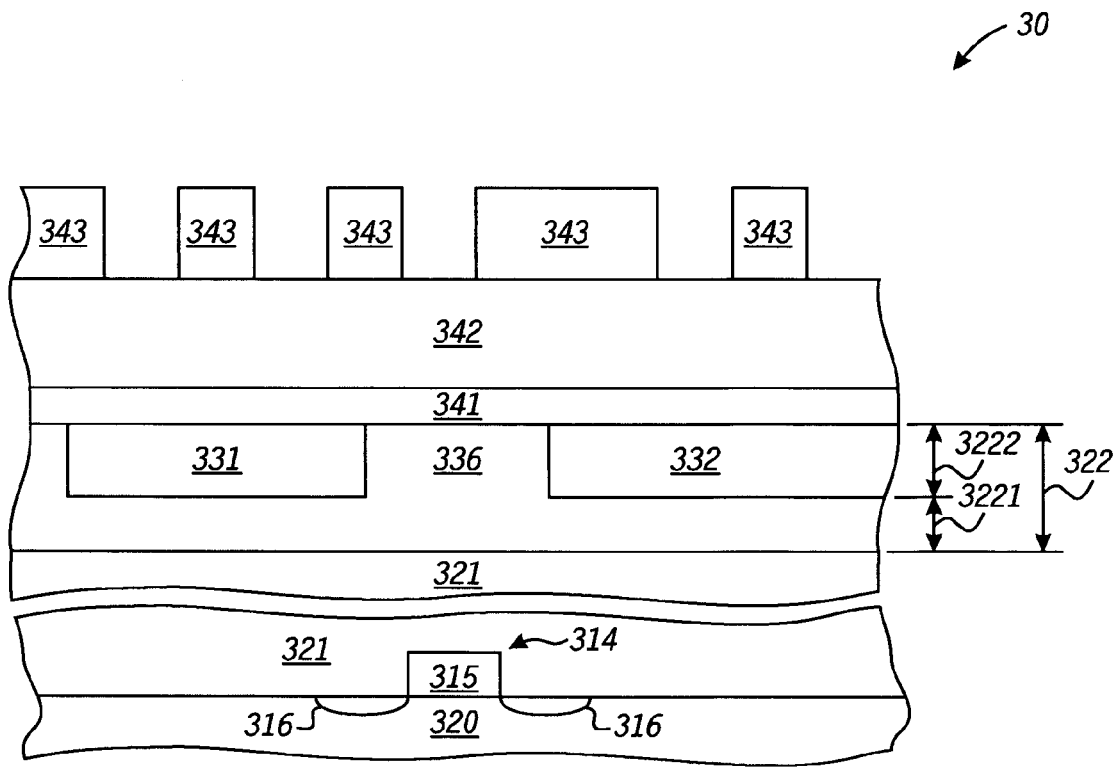

FIG. 25 illustrates workpiece 30 subsequent to patterning of layer 343 using conventional and proprietary etch techniques as are known in the art, whereby locations of layer 342 have been exposed, i.e., locations where layer 343 have been removed, indicate locations where DNT pillars are to be formed.

Figure 26:
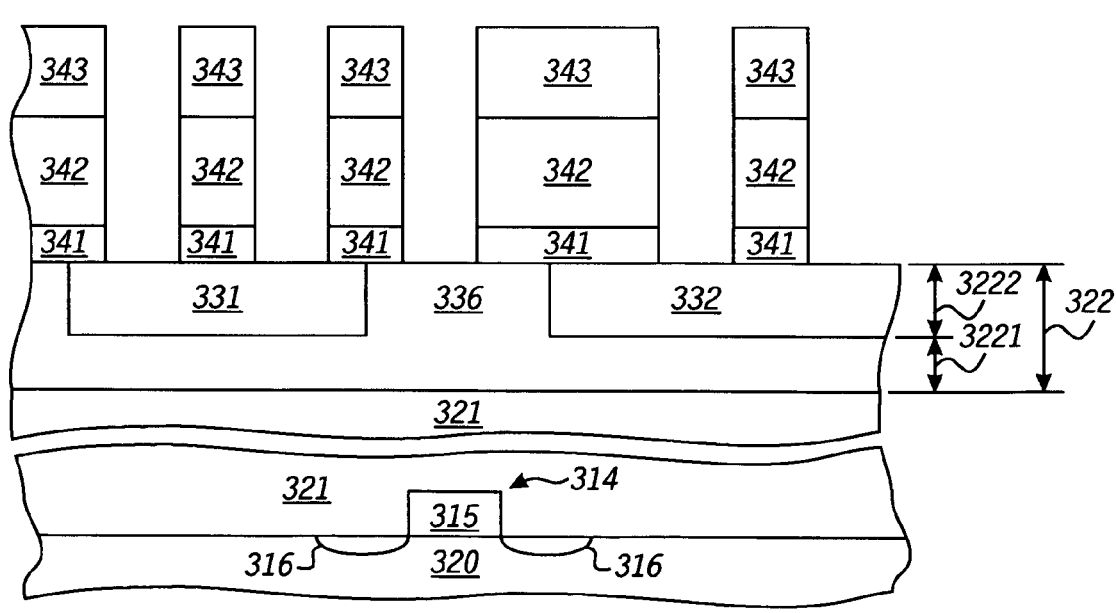

FIG. 26 illustrates workpiece 30 subsequent to removal of portions of layer 342 and layer 341 during etching accomplished using conventional and proprietary etching techniques. In on embodiment, the dielectric material of layer 342 is a TEOS dielectric material. In one embodiment, an etch of layer 342 is terminated by detecting when the material of layer 341 is encountered. In an alternate embodiment, an etch process that selectively removes layer 342 relative to layer 341 can be used to facilitate the use of a timed etch of layer 341. Portions of layer 341 remaining after removal of layer 342 can be removed by continuing the etch process that removed layer 342 for a determined amount of time, or by applying an etch process that is different from the etch process that removes layer 342. In one embodiment, the etch process that removes layer 342 is continued for a specified amount of time subsequent to detection of the material of layer 341.

Figure 27:
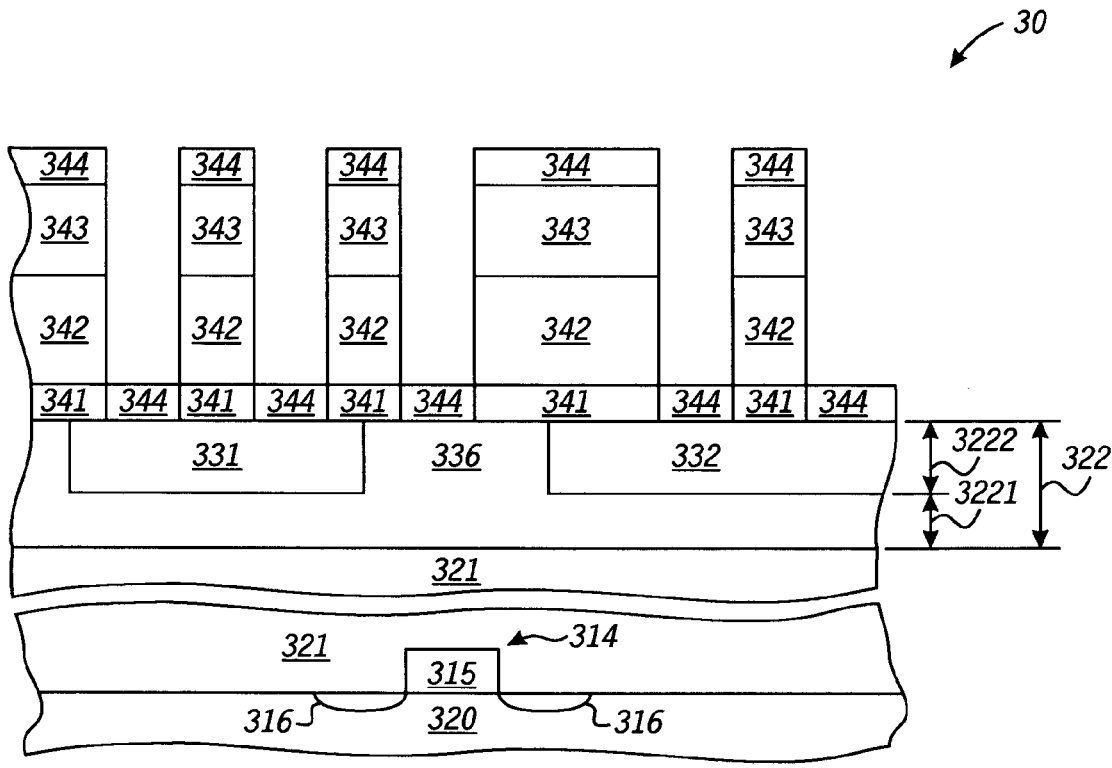

FIG. 27 illustrates workpiece 30 subsequent to formation of layer 344 that is a catalyst, such as a composite catalyst, layer that will facilitate formation of DNTs. It will be appreciated that a composite catalyst as previously described will be used if it is determined that a conductive layer underlying the DNT pillars subsequent to formation would be problematic. Alternatively, layer 344 can comprise the catalyst material without the dielectric portion of a composite catalyst if a conductive layer 344 is acceptable.

Figure 28:
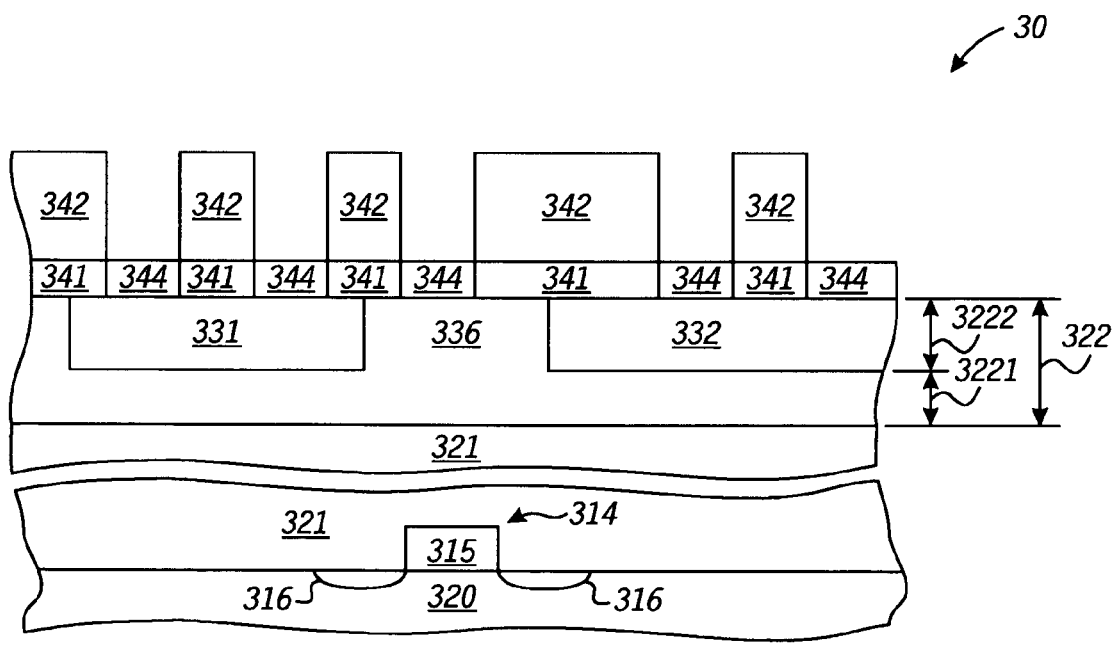

FIG. 28 illustrates workpiece 30 subsequent to a lift-off procedure that lifts-off layer 344 by removal of an underlying layer. Specifically illustrated is removal of layer 343, which as previously described can be accomplished through conventional and proprietary techniques as are known in the art.

Figure 29:
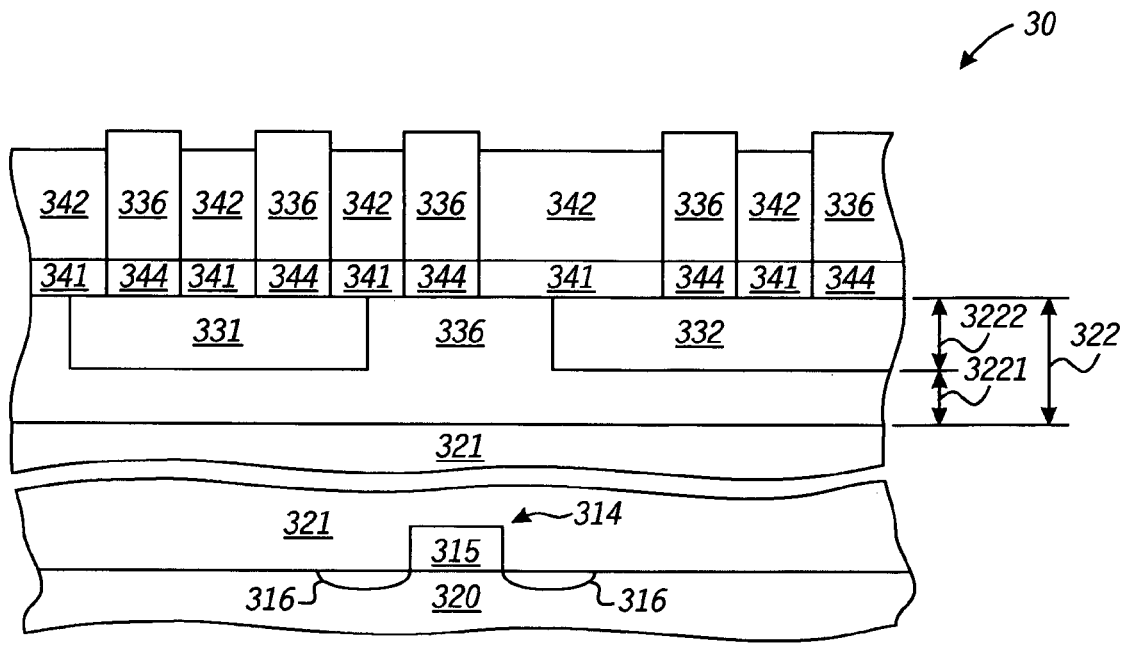

FIG. 29 illustrates workpiece 30 subsequent to forming of DNT columns 336, which can be accomplished using the techniques previously described.

Figure 30:
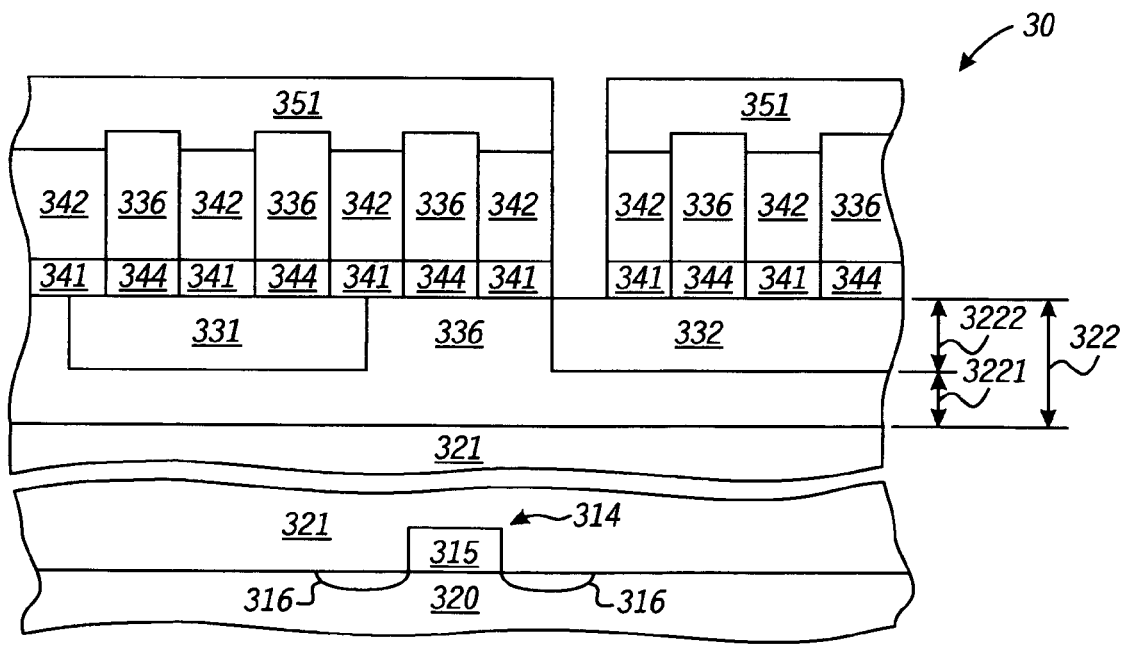

FIG. 30 illustrates workpiece 30 subsequent to forming and patterning layer 351 overlying the workpiece of FIG. 29. In addition, workpiece 30 has been etched, as previously described, to form a via interconnect opening in layer 342 to conductive portion 332. In one embodiment, layer 351 is a photoresist layer deposited and etched using conventional and proprietary techniques as is known in the art.

Figure 31:
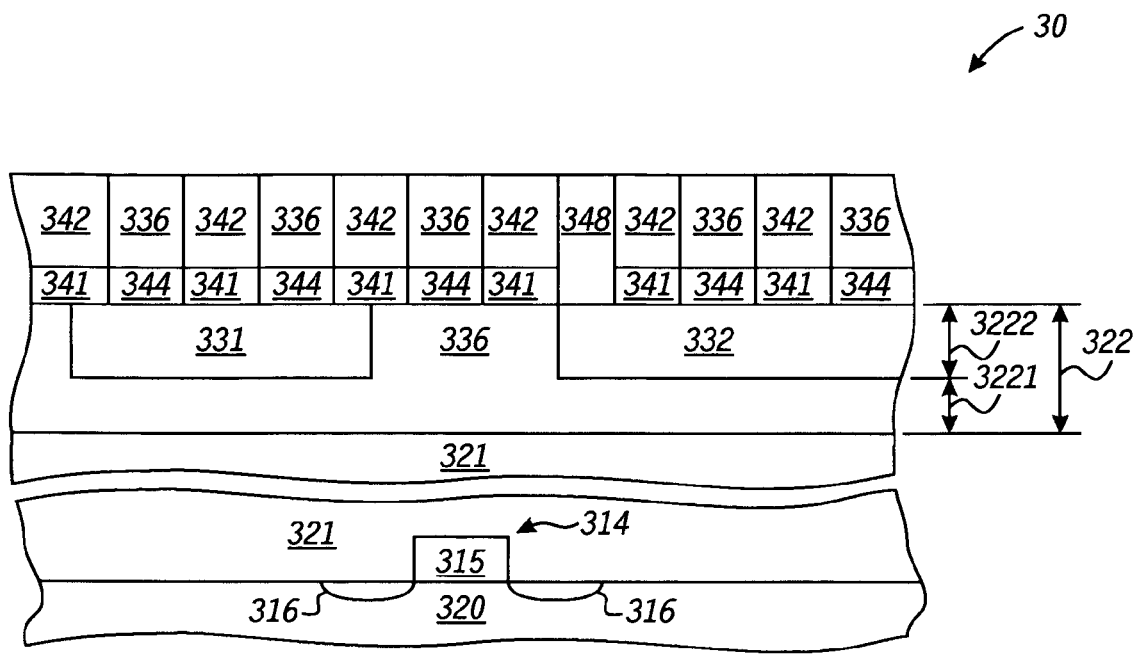

FIG. 31 illustrates workpiece 30 subsequent to formation of a conductive via 348 that can be either a conventional metal via, such as a via comprising copper or aluminum, or a CNT formed in a manner previously described. In the specific embodiment illustrated, the workpiece 30 has been planarized following the formation of a conductive material forming via 348. The formation of DNT pillars provides structural support during the planarization process to reduce dishing and other damage that can otherwise occur within dielectric material 342, especially when dielectric material 342 is a relatively soft dielectric ultra low-k (ULK) dielectric material. It is expected that at least approximately ten-percent of the dielectric material, by volume or plan view, of an inter-level dielectric layer should comprise DNTs to provide appropriate support during subsequent processing, such as polishing.

In one embodiment, a metal level can be formed overlying the workpiece of FIG. 31. In an alternate embodiment in FIGS. 32 and 33, the dielectric material 342 is replaced with a different dielectric layer to overcome potential problems associated with layer 342. One such problem occurs when layer 342 is layer 342 comprises a material that inherently has a high dielectric constant with respect to a desired material. For example, layer 342 can comprise a TEOS dielectric layer selected for ease of manufacturing, even though a TEOS dielectric may have an undesirably high dielectric constant. Alternatively, if layer 342 is selected to be a low-k dielectric material, it can be damaged during the process flows to which it is subjected.

Figure 32:
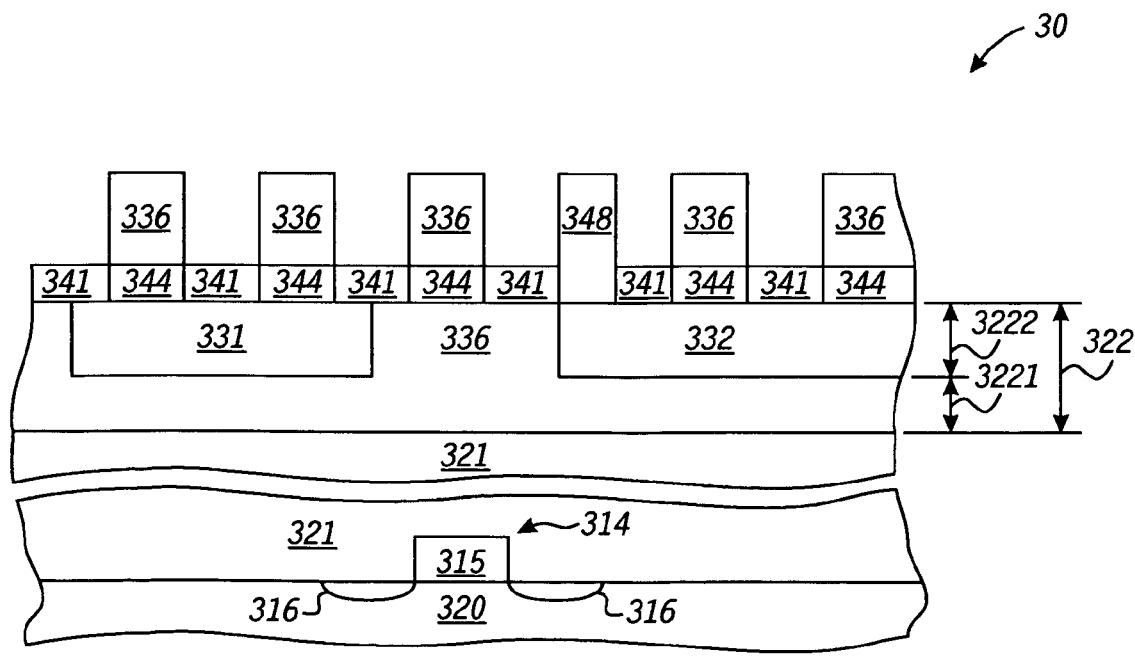
Figure 33:
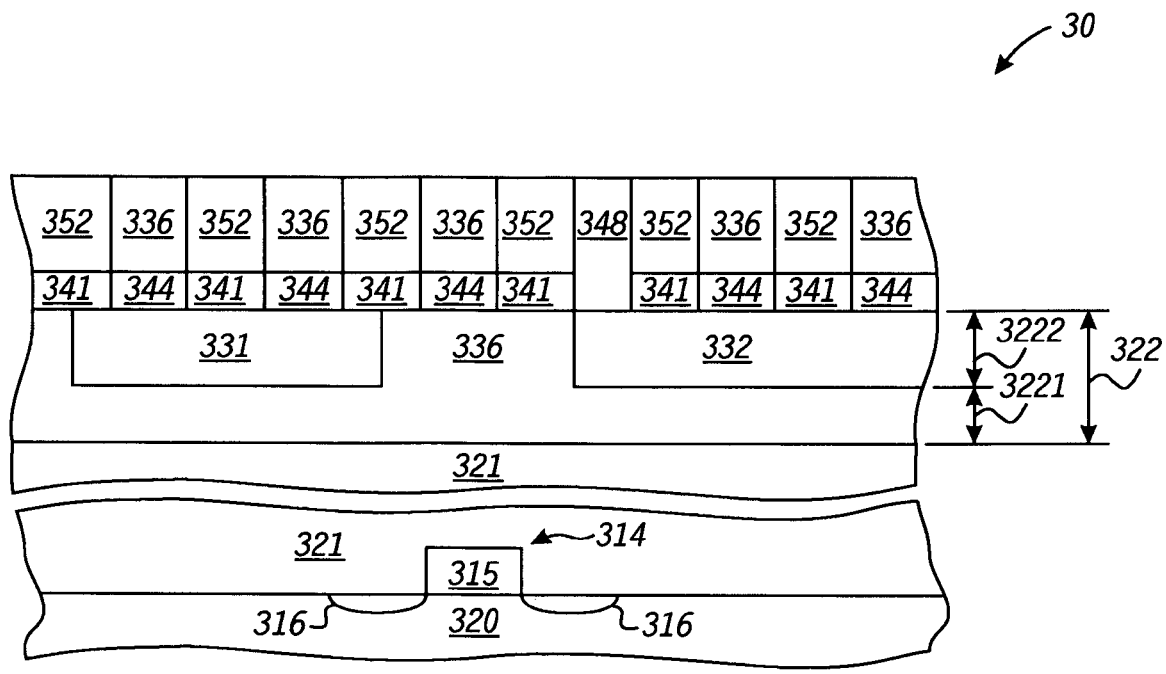

FIG. 32 illustrates an embodiment where dielectric layer 342 is sacrificial and thereby removed from workpiece 30. By removing dielectric layer 342 a new dielectric layer 352 can be deposited as illustrated in FIG. 33. In one embodiment, the new dielectric layer 352 is formed from an ultra low-k dielectric material comprising one of SICOH, BDII and BDIIx, Zirkon, MSQ, or any low-k organic material, any porous hydrofluorocarbonated silicate glass, or zeolite having a k-value of less than approximately 2.5 that have lower dielectric constant than the removed layer 342. Layer 352 can be formed from the same or different material as removed dielectric layer 342. Removal of layer sacrificial material of layer 342 leads to its replacement with a low k material that has not be subjected to deleterious effects of processing on layer 342 that would otherwise be incurred that result in diminished dielectric characteristics.

FIGS. 34-41 illustrate an alternate embodiment of the present disclosure whereby the locations of columns of DNTs are defined by the use of nanodots. As used in the present embodiment, nanodots are discrete elements that are commonly crystals that can be deposited and removed using conventional processes. Silicon nanodots having dimensions of one nanometer and greater, as needed to provide support as described herein are anticipated, and can be deposited on functionalized surfaces, for example, by e-beam writing, for placement in a patterned manner. Other nanodots are metallic (e.g., Ni Au) or dielectrics such as $ZnO_2$.

Figure 34:
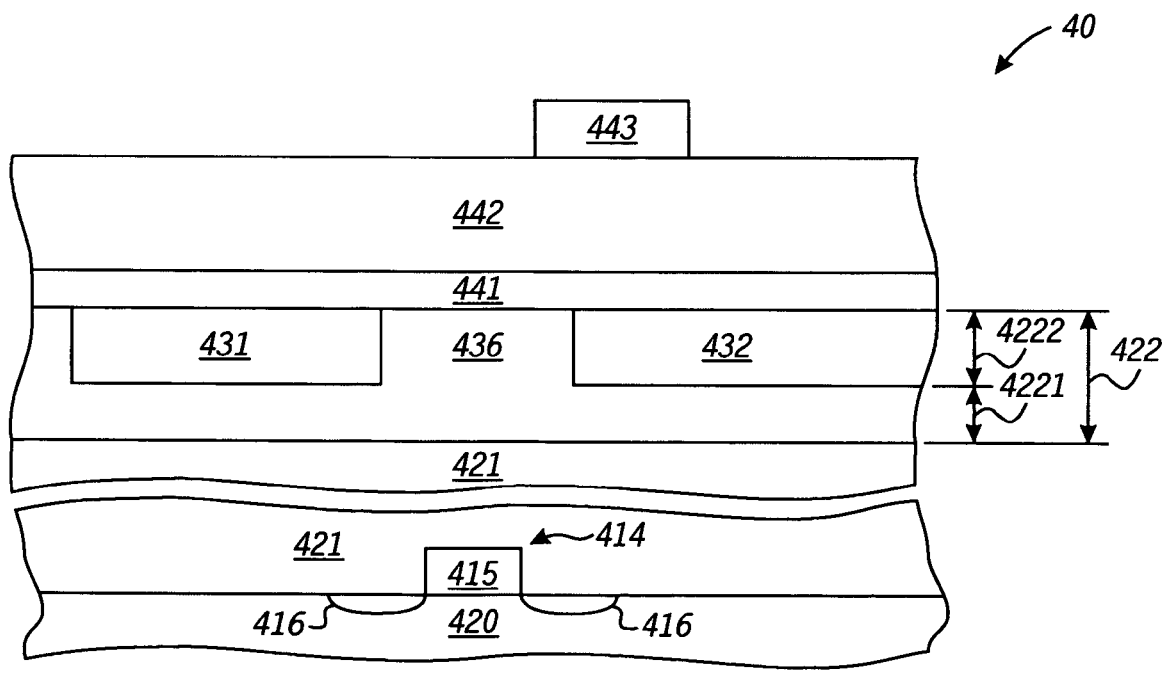
FIGS. 34-42 illustrate in cross section a semiconductor device workpiece at various manufacturing stages in accordance with an alternate embodiment of the present disclosure.

FIG. 34 illustrates a workpiece 40 at a similar stage of processing as that described with respect to FIG. 24, but with a layer 443, such as a photoresist layer, patterned to mask a location where an interconnect via will subsequently be formed. In one embodiment, workpiece 40 includes substrate 420 similar to substrate 320, intervening layers 421 similar to intervening layers 321, etch stop layer 441 similar to layer 341, dielectric material 436 similar to dielectric material 336, and electric conductors 431 and 432 similar to conductors 331 and 332, and a photoresist layer 443 that has been patterned. Additional elements corresponding to elements of FIG. 24 include layer reference 422 that includes levels 4222 and 4221, structure 414 that includes gate structure 415, and source/drain regions 416 in active region 420. In one embodiment, layer 443 is a photoresist layer that has not yet been patterned.

Figure 35:
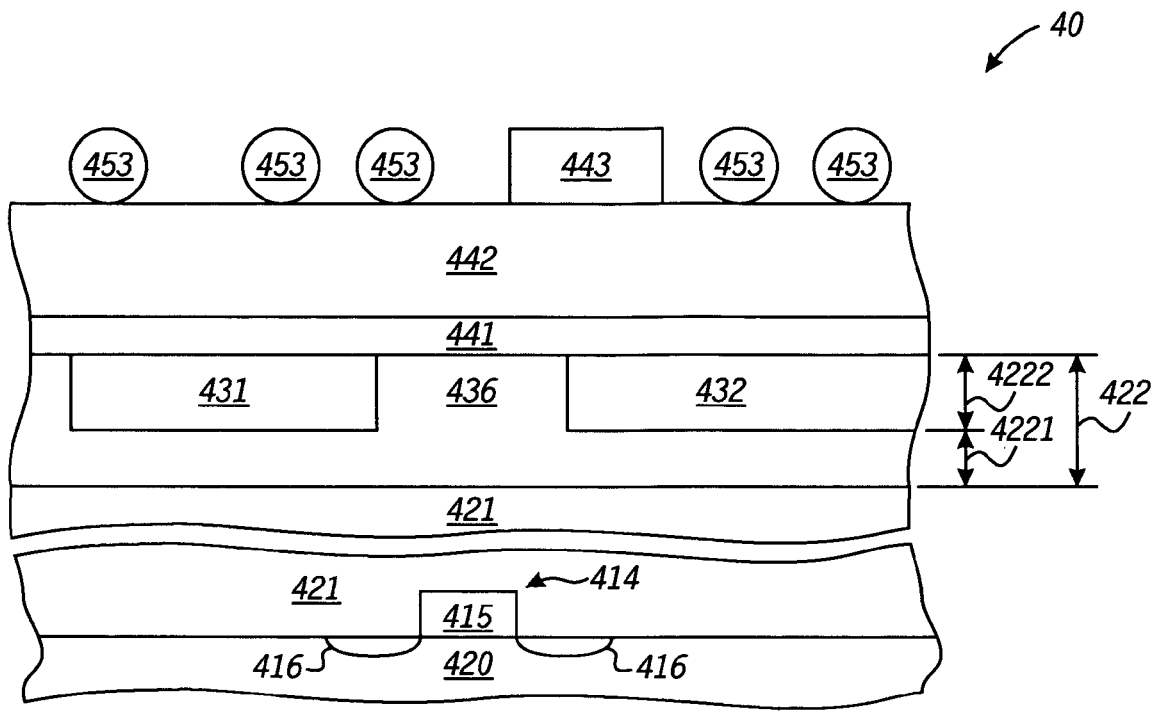

FIG. 35 illustrates workpiece 40 subsequent to placement of nanodots 453 overlying the workpiece of FIG. 34. Nanodots may be dispersed on a surface through a wide variety of known techniques including ion implantation, the use of aerosols, chemical vapor deposition (CVD), plasma assisted CVD, rapid thermal CVD (RTCVD) and laser ablation. A typical precursor for these processes is silane. The remaining portion of layer 443 prevents nanodots from being deposited at a location where a via is to be formed. It will be appreciated that the illustrated nanodots are shown as being spherical for illustration purposes only and that other shapes are contemplated and likely.

Figure 36:
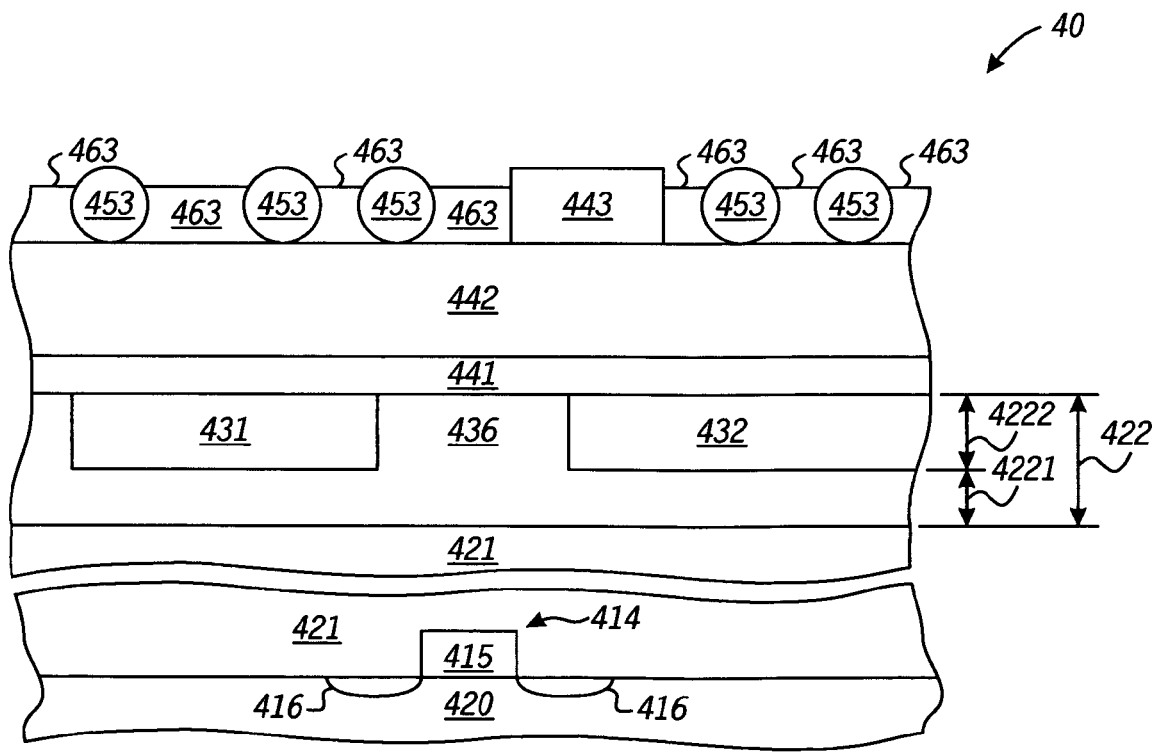

FIG. 36 illustrates workpiece 40 subsequent to formation of layer 463. Layer 463 will subsequently be used as a mask layer and is formed from a material that is selectively etchable relative the nanodots 453. For example, when the nanodots 453 are formed from silicon using silane based RTCVD, layer 463 can be formed from spin coating an organic polymer layer such as a photoresist that does not wet the silicon, thereby facilitating exposure of the upper portion of the nanodots for removal during a subsequent process.

Figure 37:
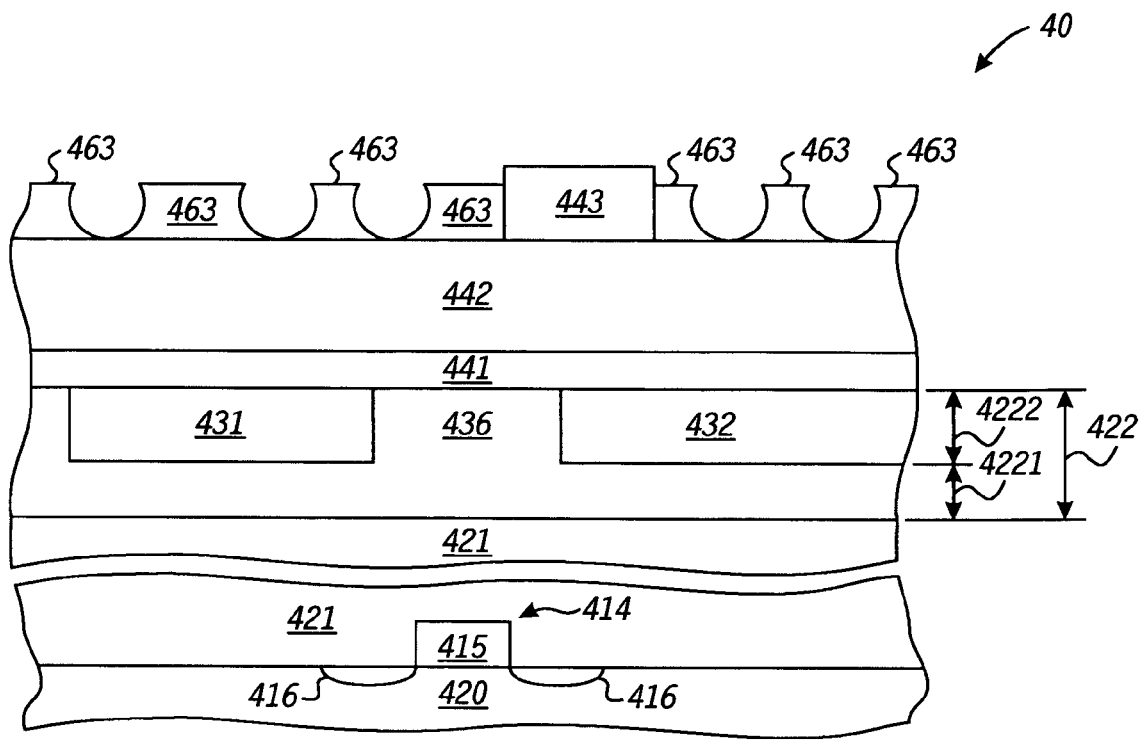

FIG. 37 illustrates workpiece 40 subsequent to removal of nanodots 453, thereby forming a patterned mask from layer 463. Removal of nanodots 453 can be accomplished using conventional and proprietary etch techniques that are selected based upon the materials used to form the nanodots 453 and layer 463 that are known in the art. The openings in layer 453 where the nanodots have been removed are indicative of locations where DNT pillars are to be formed.

Figure 38:
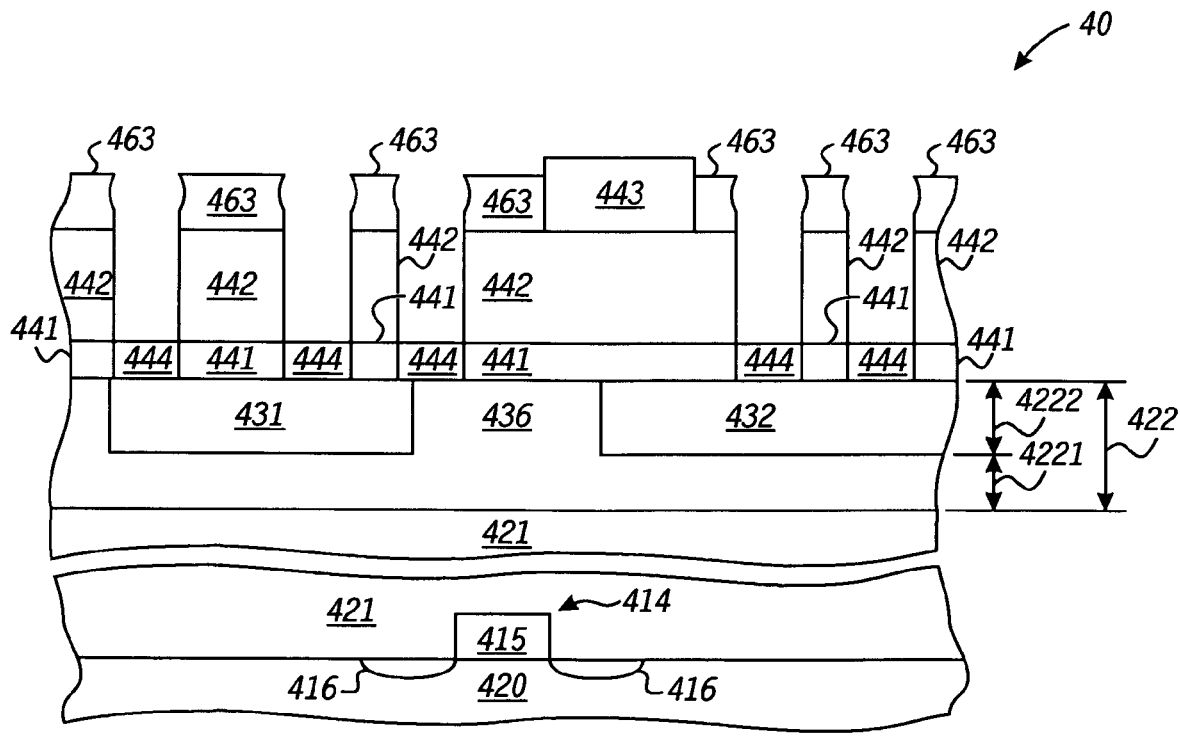

FIG. 38 illustrates workpiece 40 subsequent to removal of portions of layer 442 and layer 441 during etching, and formation of catalyst layer 444 subsequent to removal of layer 332, using techniques previously discussed with respect to other embodiments. In one embodiment, the dielectric material of layer 443 is a TEOS dielectric material that is readily etched using conventional and proprietary techniques that are well known.

Figure 39:
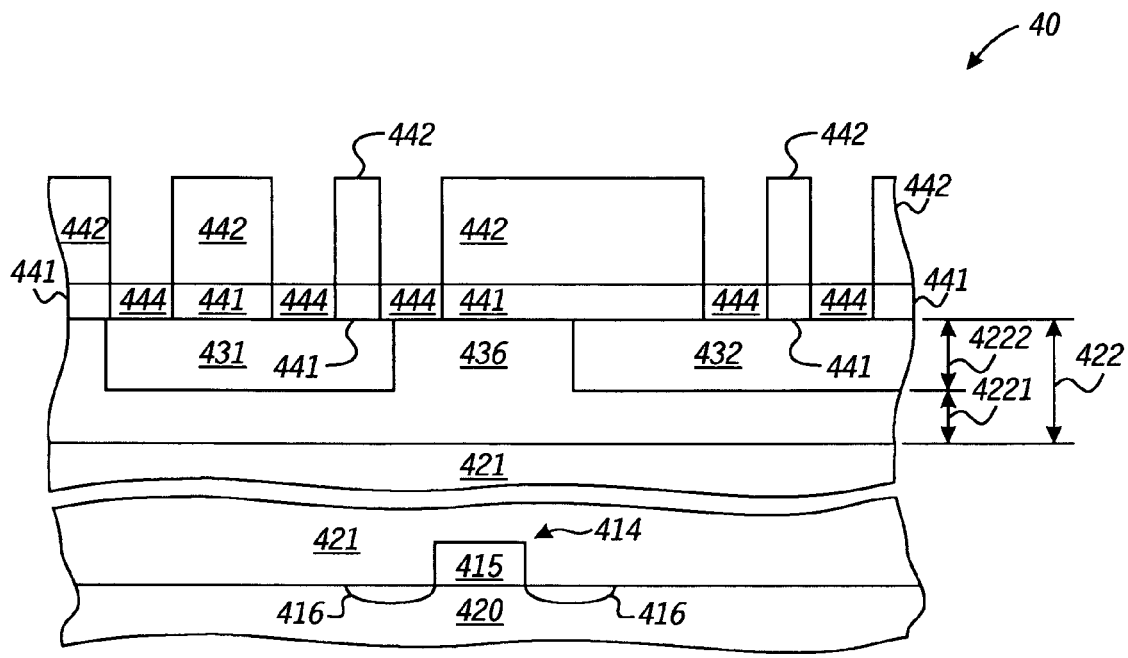

FIG. 39 illustrates workpiece 40 subsequent to a lift off procedure whereby removal of layer 463 and 443 using an etch process results in overlying portions of layer 444 being "lifted off" as well, as previously described.

Figure 40:
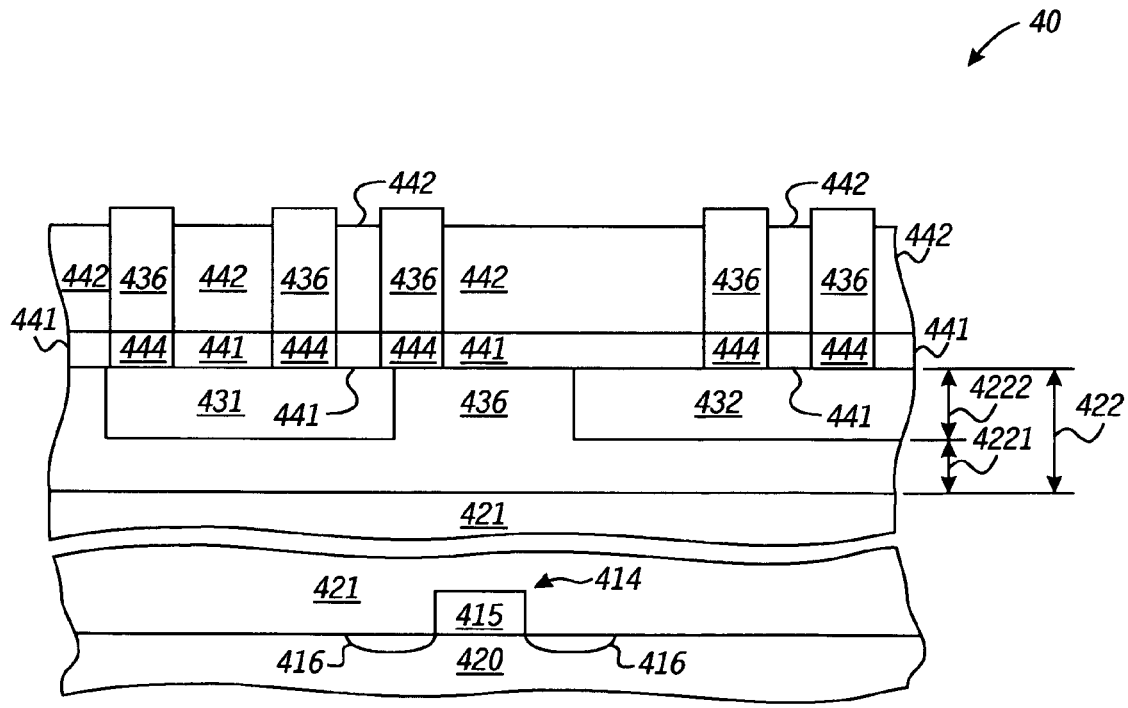

FIG. 40 illustrates workpiece 40 subsequent to forming of BNT columns 436 using techniques previously described.

Figure 41:
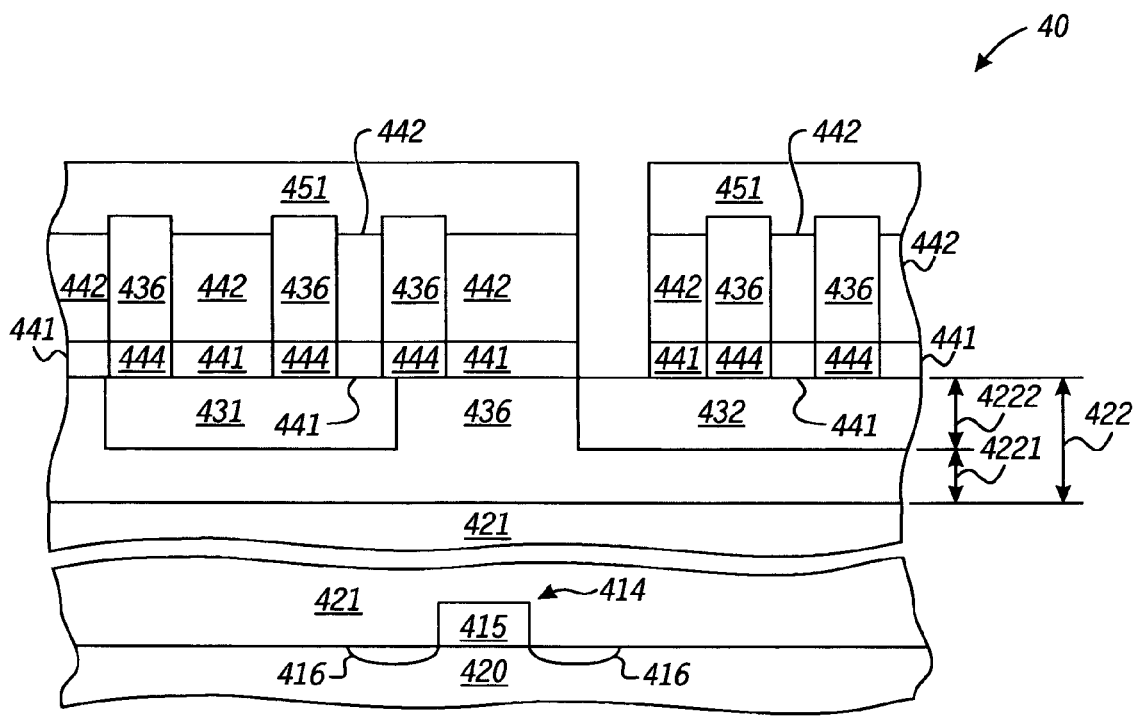

FIG. 41 illustrates workpiece 40 subsequent to forming and patterning layer 451 overlying the workpiece of FIG. 40. In addition, workpiece 40 has been etched, as previously described, to form a via interconnect opening to conductive portion 432.

Figure 42:
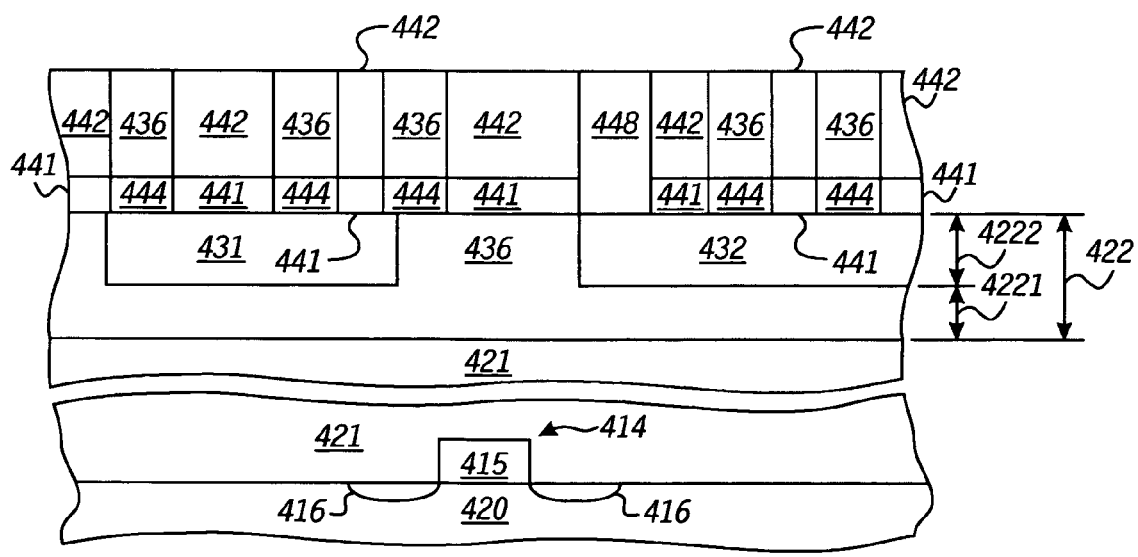

FIG. 42 illustrates workpiece 40 subsequent to formation of a conductive via 448 and planarization similar to that previously described. The use of DNT pillars in this manner provides structural support during the planarization process to reduce dishing that could otherwise occur within the relatively soft dielectric layer 442.

It will be appreciated that prior or subsequent to planarization of workpiece 40 that the dielectric 442 can be removed and replaced as previously described, thereby facilitating the use of low-k dielectrics that have not been subjected to damage by the processes used to form the DNTs 436 and via 448.

Formation of DNT columns at a specific layer, whether through the use of masking techniques or the use of nanodots, will typically account for approximately ten-percent or more of the dielectric material from a plan view in order to provide an appropriate amount of strength to the specific layer.

Figure 43:
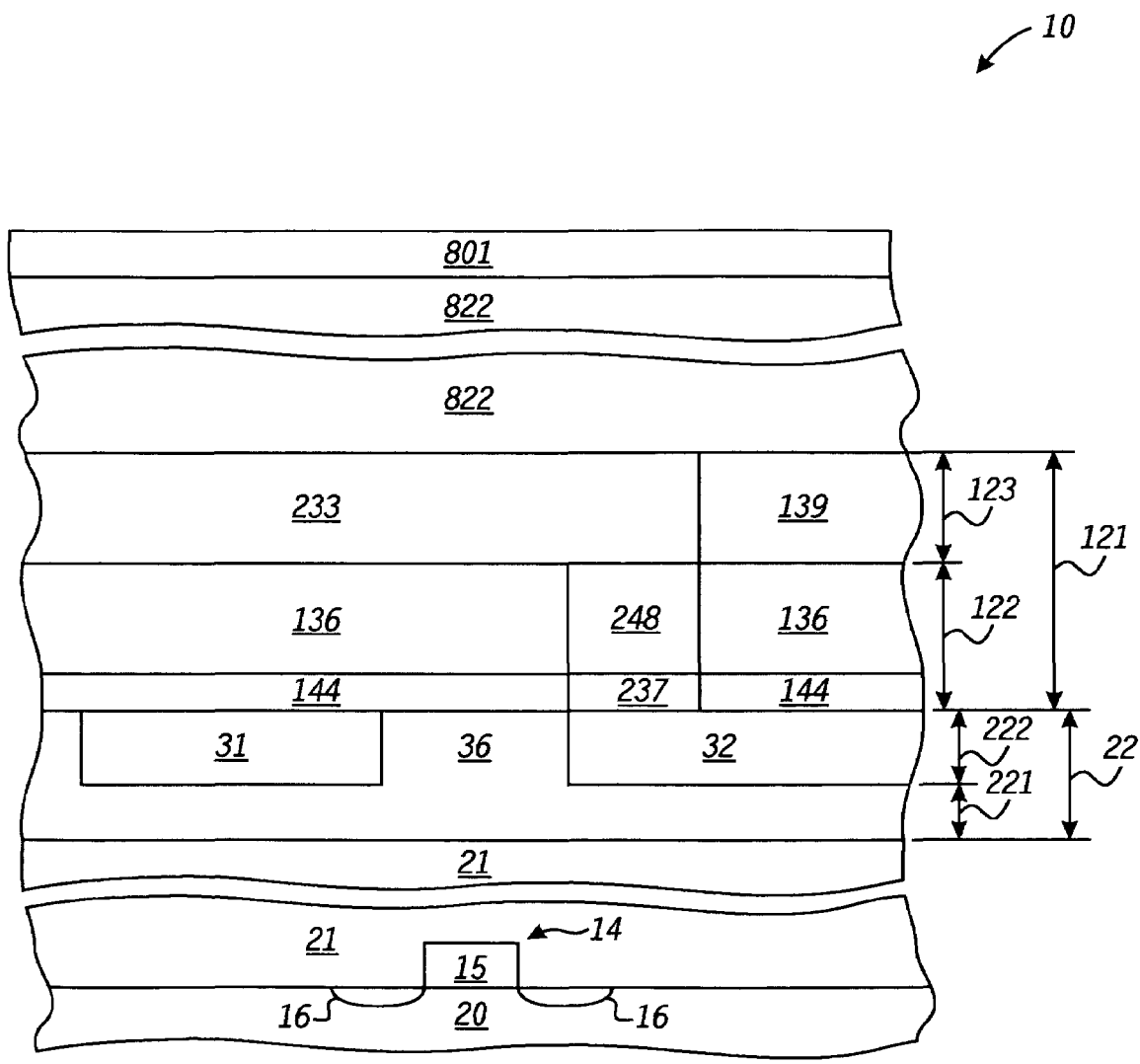
FIG. 43 illustrates a specific embodiment of a completed semiconductor device based upon FIG. 23.

FIG. 43 illustrates a completed semiconductor device based upon FIG. 23 that includes additional layers 822 and a passivation layer 801 overlying the device. The completed semiconductor device of FIG. 43 can be mounted on various substrates, including package substrates using conventional and proprietary interconnect structures of the device of FIG. 23, which can include bond pad and interconnect "bump" structures that are not specifically illustrated.

Some terms are defined or clarified with respect to the disclosure herein. For example, group numbers, if any, corresponding to columns within the Periodic Table of the elements use the "New Notation" convention as seen in the CRC Handbook of Chemistry and Physics, 81$^{st}$ Edition (2000).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

It will be appreciated by those skilled in the art that the term "layer" can include one or more layers. For example, a dielectric or conductive layer may include one or more interfacial layers to facilitate various manufacturing objectives such as to improve adhesion of one layer to another, improve patterning and etching of a layer, to prevent diffusion from one layer to another, and the like.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

In the foregoing specification, principles of the disclosure have been described above in connection with specific embodiments. However, one of ordinary skill in the art appreciates that one or more modifications or one or more other changes can be made to any one or more of the embodiments without departing from the scope of the disclosure as set forth in the claims below. Accordingly, the specification and figures are to be regarded in an illustrative rather than a restrictive sense and any and all such modifications and other changes are intended to be included within the scope of disclosure.

What is claimed is:

1. A method comprising:
    forming a conducting via at a first level of a workpiece, wherein the workpiece is an electronic semiconductor device workpiece;
    forming a first layer comprising a plurality of dielectric nanotubes at the first level using a composite catalyst, wherein the composite catalyst comprises a material having a plurality of composite portions including a catalyst and a dielectric material, and at least a majority of the dielectric nanotubes are upright dielectric nanotubes;
    forming at the first level a first dielectric layer of a first dielectric material, wherein the first dielectric layer is formed prior to formation of the plurality of dielectric nanotubes; and
    forming at the first level a second dielectric layer of a second dielectric material, wherein the second dielectric layer is formed prior to formation of the plurality of dielectric nanotubes, and the second dielectric layer is at least partially removed prior to forming the plurality of dielectric nanotubes, and the first dielectric layer remains after at least partially removing the second dielectric layer.

2. The method of claim 1, wherein the upright dielectric nanotubes comprise boron.

3. The method of claim 1, wherein forming the first layer comprises forming the dielectric nanotubes using a tip-seed composite catalyst.

4. The method of claim 1, wherein forming the first layer comprises forming the dielectric nanotubes using a root-seed composite catalyst.

5. The method of claim 1, wherein forming the conductive via comprises forming the conducting via using an upright carbon nanotube.

6. The method of claim 5, wherein forming the first layer comprises forming the dielectric nanotubes using a tip-seed composite catalyst.

7. The method of claim 5, wherein forming the first layer comprises forming the dielectric nanotubes using a root-seed composite catalyst.

8. The method of claim 1, wherein the upright dielectric nanotubes form a substantial portion of an inter-level dielectric layer of the electronic semiconductor device, wherein the substantial portion of the inter-level dielectric layer comprises the plurality of dielectric nanotubes forming greater than approximately 10% of the inter-level dielectric layer from a plan view.

9. The method of claim 8, wherein the substantial portion of the inter-level dielectric layer comprises the plurality of dielectric nanotubes forming substantially all of the inter-level dielectric layer from a plan view.

10. The method of claim 1 wherein forming the conductive via comprises forming the conducting via using at least one of copper and aluminum.

11. The method of claim 1, wherein forming the first layer comprises forming a layer comprising composite catalyst and forming the plurality of dielectric nanotubes at the layer comprising the composite catalyst.

* * * * *